(12) United States Patent
Lu et al.

(10) Patent No.: US 12,550,460 B2
(45) Date of Patent: Feb. 10, 2026

(54) HIGH ABSORPTION STRUCTURE FOR OPTOELECTRONIC DEVICE

(71) Applicant: Taiwan Semiconductor Manufacturing Company, Ltd., Hsinchu (TW)

(72) Inventors: Chun-Liang Lu, Tainan (TW); Chun-Hao Chou, Tainan (TW); Kuo-Cheng Lee, Tainan (TW); Wei-Lin Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 399 days.

(21) Appl. No.: 18/181,982

(22) Filed: Mar. 10, 2023

(65) Prior Publication Data

US 2024/0304653 A1    Sep. 12, 2024

(51) Int. Cl.
*H01L 27/146*  (2006.01)
*H10F 39/00*   (2025.01)

(52) U.S. Cl.
CPC ....... *H10F 39/014* (2025.01); *H10F 39/8027* (2025.01)

(58) Field of Classification Search
CPC .................... H10F 39/014; H10F 39/8027
USPC ........................................................ 257/290
See application file for complete search history.

(56) References Cited

U.S. PATENT DOCUMENTS

| | | | |
|---|---|---|---|
| 9,269,531 B2 | 2/2016 | Stekelenburg et al. | |
| 10,510,910 B2 | 12/2019 | Wu et al. | |
| 11,075,242 B2 | 7/2021 | Kuo et al. | |
| 11,600,647 B2 | 3/2023 | Tsao et al. | |
| 2013/0161584 A1* | 6/2013 | Crowder | H10H 20/825 |
| | | | 438/42 |
| 2016/0370505 A1* | 12/2016 | Koo | H10F 39/805 |
| 2018/0053800 A1* | 2/2018 | Tu | H10F 39/8053 |
| 2019/0148422 A1* | 5/2019 | Cheng | H10F 39/199 |
| | | | 257/446 |

(Continued)

FOREIGN PATENT DOCUMENTS

| | | |
|---|---|---|
| CN | 102376516 A | 3/2012 |
| CN | 109841641 B | 6/2021 |
| TW | 202133417 A | 9/2021 |

*Primary Examiner* — Tong-Ho Kim
(74) *Attorney, Agent, or Firm* — Harrity & Harrity, LLP

(57) ABSTRACT

Some implementations described herein provide an optoelectronic device and methods of formation. The optoelectronic device is fabricated using a series of operations that includes a patterning operation using a layer of a negative photoresist material, followed by a single dry etch operation, a single wet strip operation, and a single wet etch operation. The series of operations may include a reduced number of operations relative to another series of operations that include a patterning operation using a layer of a positive photoresist material. Through the reduced number of operations, handling-induced damage to the device may be reduced. Additionally, the high absorption structure may include a quantum efficiency that is greater relative to another quantum efficiency of another high absorption structure formed through the series of operations that include the patterning operation using the layer of the positive photoresist material.

20 Claims, 35 Drawing Sheets

(56) References Cited

U.S. PATENT DOCUMENTS

2019/0148570 A1* 5/2019 Wu ..................... H10F 39/011
                                                         257/187
2019/0288027 A1   9/2019 Su et al.

* cited by examiner

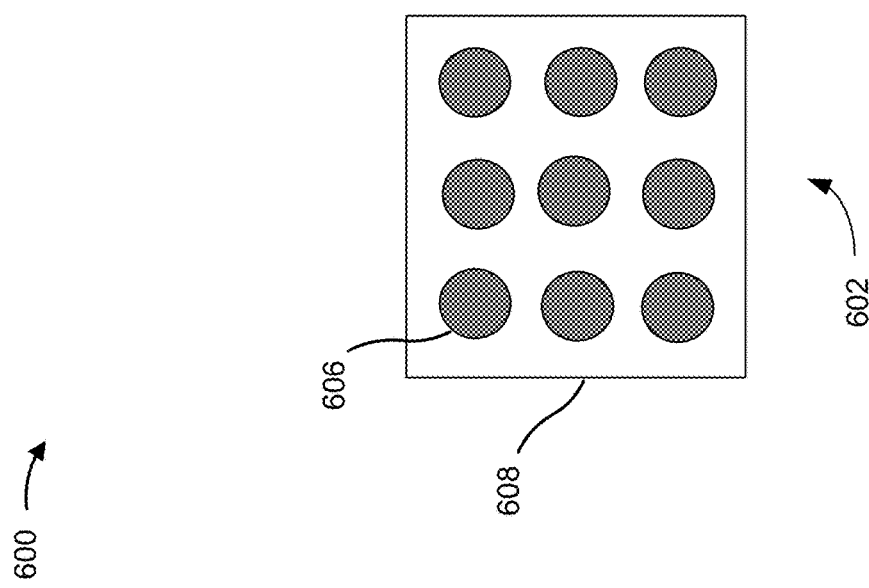
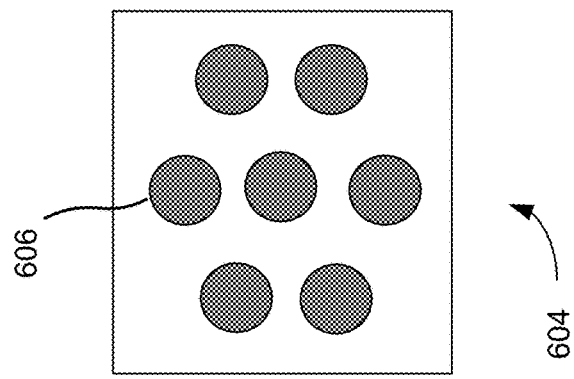
FIG. 6

HIGH ABSORPTION STRUCTURE FOR OPTOELECTRONIC DEVICE

BACKGROUND

Digital cameras may include optoelectronic devices such as image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. The image sensor may include high absorption regions above photodiodes of the image sensor to improve a performance of the image sensor, where the high absorption regions include structures that may increase an amount of the incident light absorbed by the photodiodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a diagram of an implementation of example photomask patterns described herein.

DETAILED DESCRIPTION

Figure 1:
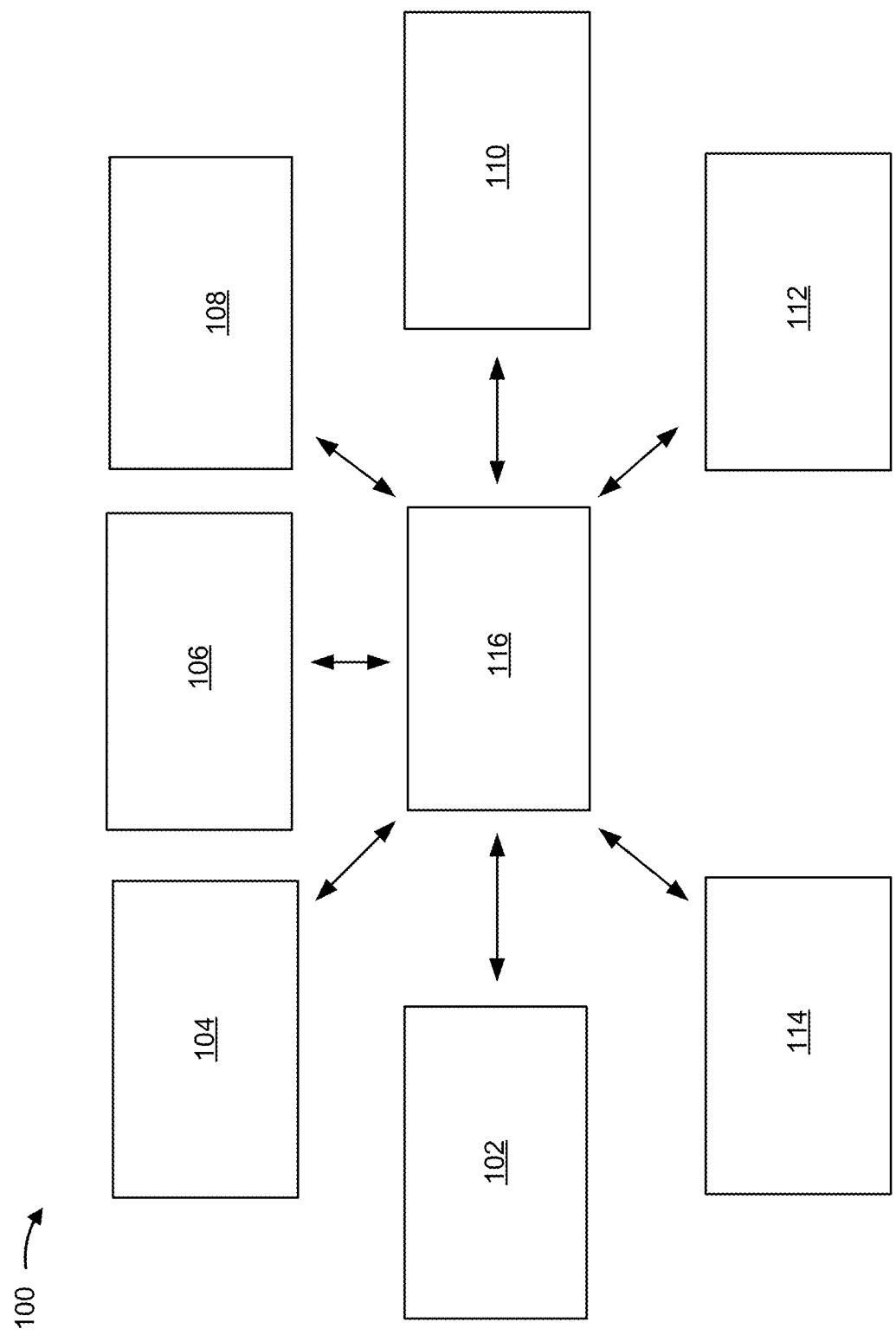
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "over," "under," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases an optoelectronic device, such as a complimentary metal-oxide image sensor (CIS) device, includes a high absorption (HA) structure that absorbs photons to generate an electrical current. Semiconductor manufacturing techniques to fabricate the HA structure may include a series of operations that include a patterning operation using a layer of a positive photoresist material, followed by a dry strip removal operation to remove the layer of positive photoresist material. The series of operations may further include a deposition operation to deposit a layer of a hard mask material, two or more wet etching operations to form the absorption structure, and a removal operation to remove the layer of the hard mask material. After the series of operations, a quantum efficiency of the HA structure (e.g., an efficiency with which the HA structure absorbs photons) may not satisfy a threshold that supports a targeted performance of the optoelectronic device. As a result, a manufacturing yield of a volume of the optoelectronic device may decrease.

Some implementations described herein provide an optoelectronic device and methods of formation. The optoelectronic device is fabricated using a series of operations that includes a patterning operation using a layer of a negative photoresist material, followed by a single dry etch operation, a single wet strip operation, and a single wet etch operation. The series of operations may include a reduced number of operations relative to another series of operations that include a patterning operation using a layer of a positive photoresist material. Through the reduced number of operations, handling-induced damage to the device may be reduced. Additionally, the HA structure may include a quantum efficiency that is greater relative to another quantum efficiency of another HA structure formed through the series of operations that include the patterning operation using the layer of the positive photoresist material.

In this way, a manufacturing yield of an optoelectronic device including the HA structure that satisfies the quantum efficiency threshold may increase relative to another optoelectronic device not including the HA structure. Additionally, or alternatively, an amount of resources to fabricate a volume of the optoelectronic device including the HA structure (e.g., an amount of semiconductor manufacturing tools, raw materials, manpower, and/or computing resources, among other examples) may be decreased.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, and/or another type of device that is used to transport wafers and/or dies between semiconductor processing tools 102-114 and/or to and from other locations such as a wafer rack, a storage room, and/or the like. In some implementations, the wafer/die transport tool 116 may be a programmed device that is configured to travel a particular path and/or may operate semi-autonomously or autonomously.

As described in greater detail in connection with FIGS. 3A-3D, 4E-4I, 8, 9, and elsewhere herein, the semiconductor processing tools 102-114 may perform a series of operations related to forming an HA structure for an optoelectronic device. The series of operations includes, for example, patterning a field of openings in a layer of a negative photoresist material on a semiconductor substrate. The series of operations includes forming a field of HA structures within the field of openings by performing a single dry etch operation, where the single dry etch operation forms a carbon layer on a surface the semiconductor substrate, a single wet strip operation after the single dry etch operation, where the single wet strip operation removes the layer of the negative photoresist material, and a single wet etch operation after the single wet strip operation.

Additionally, or alternatively, the series of operations includes forming a layer of a photoresist material on a semiconductor substrate. The series of operations includes forming an opening in the layer of the photoresist material to expose a plateau region. The series of operations includes forming a carbon layer within the plateau region. The series of operations includes removing the layer of the photoresist material. The series of operations includes forming an HA structure that is adjacent to an approximate center of the plateau region.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
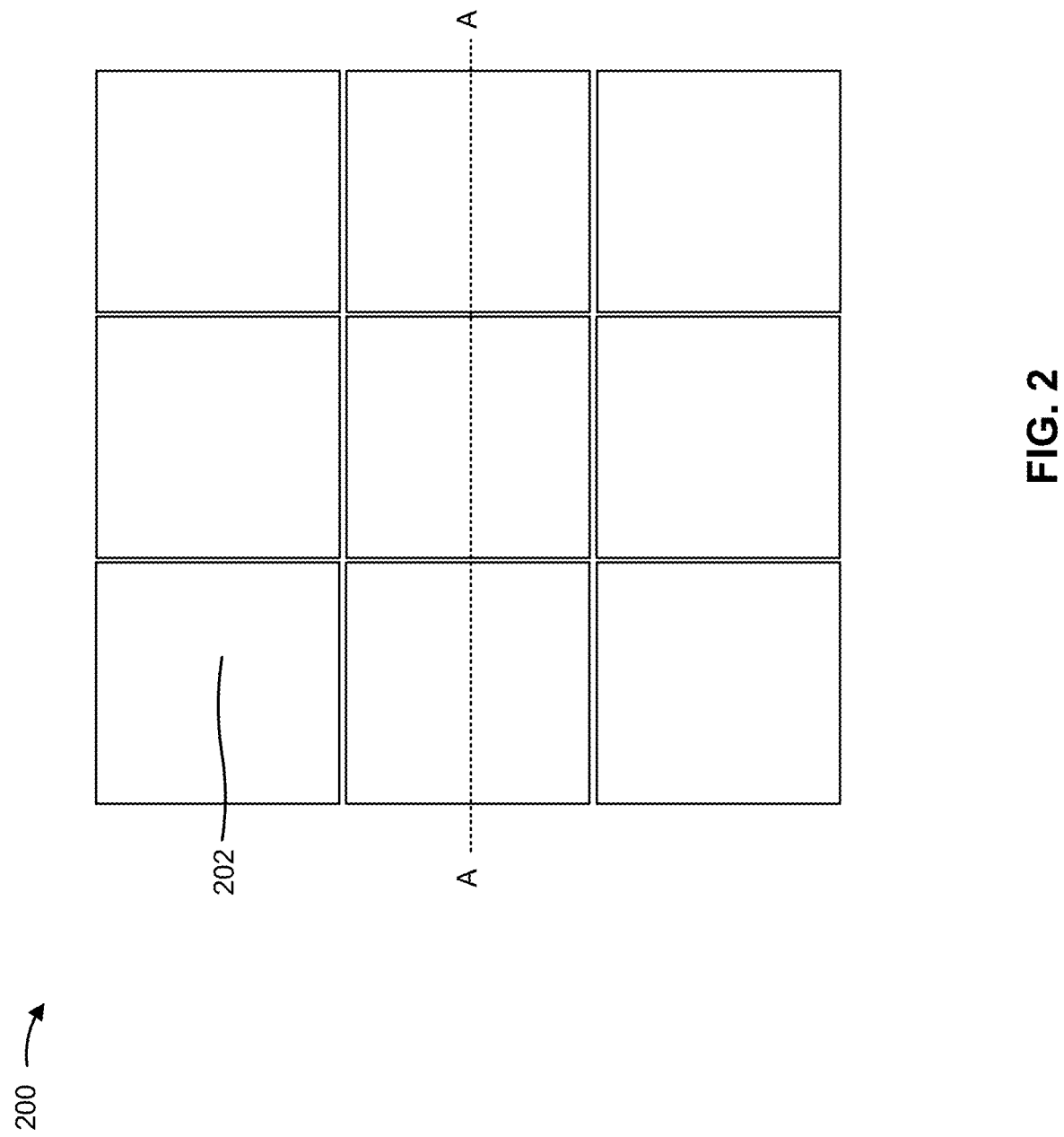
FIG. 2 is a diagram of an example pixel array described herein.

FIG. 2 is a diagram of an example pixel array 200 (or a portion thereof) described herein. The pixel array 200 may be included in an optoelectronic device including an HA structure, such as a complementary metal-oxide image sensor (CIS) device, or another type of device.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

Figure 3A:
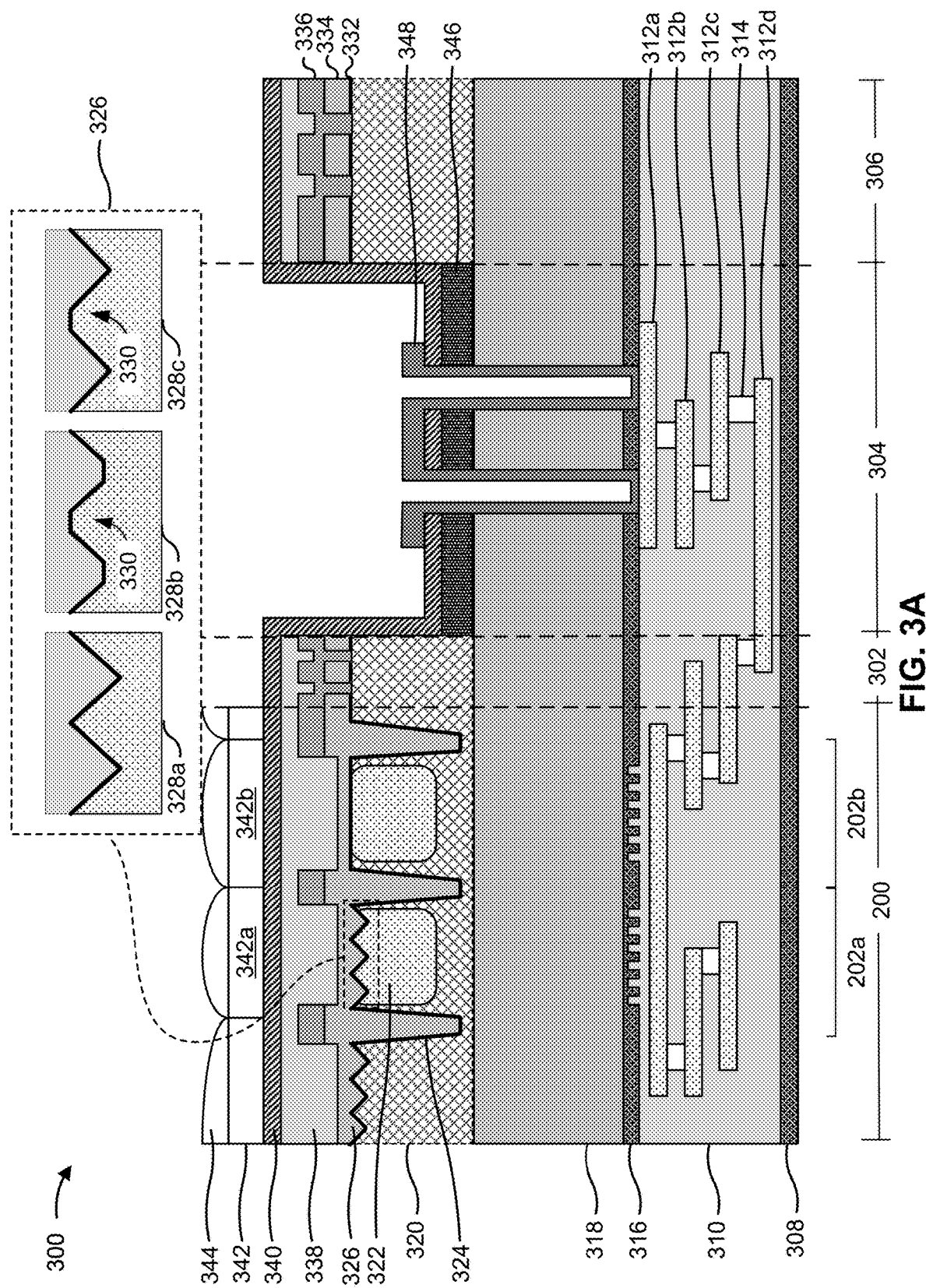
FIGS. 3A-3D are diagrams of an example image sensor including a high absorption structure described herein.

FIGS. 3A-3D are diagrams of an example image sensor including a high absorption structure described herein. FIG. 3A is a diagram of an example optoelectronic device 300 (or a portion thereof) described herein. As shown in FIG. 3, the optoelectronic device 300 may include the pixel array 200. FIG. 3A illustrates a cross-sectional view of the optoelectronic device 300, which includes a cross-sectional view of the pixel array 200 along line AA of FIG. 2. The optoelectronic device 300 may correspond to a CIS device, or another type of device. The optoelectronic device 300 may be configured to be deployed in various implementations, such as digital cameras, video recorders, night-vision cameras, automotive sensors and cameras, and/or other types of light-sensing implementations.

As shown in FIG. 3A, the optoelectronic device 300 may include a plurality of regions, such as the pixel array 200, a metal shield region 302, a bonding pad region 304 (which may also be referred to as an E-pad region), and a scribe line region 306. The pixel array 200 may include the pixel sensors 202 of the optoelectronic device 300, such as pixel sensor 202a and pixel sensor 202b. In some implementations, the optoelectronic device 300 includes a greater quantity of pixel sensors 202 or fewer pixel sensors 202 than the quantity of pixel sensors illustrated in FIG. 3A.

The metal shield region 302 may include one or more devices that are maintained in an optically dark environment. For example, the metal shield region 302 may include a reference pixel that is used to establish a baseline of an intensity of light for the optoelectronic device 300. In some implementations, the metal shield region 302 includes periphery devices, such as one or more application-specific integrated circuit (ASIC) devices, one or more system-on-chip (SOC) devices, one or more transistors, and/or one or more other components configured to measure the amount of charge stored by the pixel sensors 202 to determine light intensity of incident light and/or to generate images and/or video (e.g., digital images, digital video).

The bonding pad region 304 may include one or more conductive bonding pads (or e-pads) and/or metallization layers through which electrical connections between the optoelectronic device 300 and outside devices and/or external packaging may be established. The scribe line region 306 may include a region that separates one semiconductor die or portion of a semiconductor die that includes the optoelectronic device 300 from an adjacent semiconductor die or portion of the semiconductor die that includes other image sensors and/or other integrated circuits.

As further shown in FIG. 3A, the optoelectronic device 300 may include various layers and/or structures. In some implementations, the optoelectronic device 300 may be mounted and/or fabricated on a carrier substrate (not shown) during one or more semiconductor processing operations to form the optoelectronic device 300. As shown in FIG. 3A, the optoelectronic device 300 may include a buffer layer 308. The buffer layer 308 may include a dielectric material such as a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material. The buffer layer 308 may serve as a layer by which the optoelectronic device 300 is bonded to the carrier substrate so that back side processing may be performed on the optoelectronic device 300.

As further shown in FIG. 3A, the optoelectronic device 300 may include an inter-metal dielectric (IMD) layer 310 above and/or on the buffer layer 308. The IMD layer 310 may include one or more layers of dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material). Various metallization layers 312 may be formed in and/or in between the layers of the IMD layer 310. The metallization layers 312 may include bonding pads, conductive lines, and/or other types of conductive structures that electrically connect the various regions of the optoelectronic device 300 and/or electrically connect the various regions of the optoelectronic device 300 to one or more external devices and/or external packaging. The metallization layers 312 may be interconnected by contacts 314, which may also be referred to as vias. For example, a metallization layer 312a may be electrically connected to a metallization layer 312b by one or more contacts 314, the metallization layer 312b may be electrically connected to a metallization layer 312c by one or more contacts 314, the metallization layer 312c may be electrically connected to a metallization layer 312d by one or more contacts 314, and so on. The metallization layers 312 and the contacts 314 may be referred to as a BEOL metallization stack, and may include a conductive material, such as gold, copper, silver, cobalt, tungsten, a metal alloy, or a combination thereof, among other examples.

As further shown in FIG. 3, the image sensor 300 may include an un-doped silicate glass (USG) layer 316 above and/or on the IMD layer 310. The USG layer 316 may function as an insulator and a passivation layer between the IMD layer 310 and an interlayer dielectric (ILD) layer 318 above the IMD layer 310. The ILD layer 318 may include a dielectric material (e.g., a silicon oxide ($SiO_x$), a silicon nitride ($Si_xN_y$), a silicon oxynitride (SiON), tetraethyl orthosilicate oxide, phosphosilicate glass (PSG), borophosphosilicate glass (BPSG), fluorinated silica glass (FSG), carbon doped silicon oxide, or another dielectric material).

The substrate layer 320 may be referred to as a device substrate on which back side processing of the optoelectronic device 300 is performed. The substrate layer 320 may include a silicon layer, a layer formed of a material including silicon, a III-V compound semiconductor layer such as gallium arsenide (GaAs) layer, a silicon on insulator (SOI) layer, or another type of substrate that is capable of generating a charge from photons of incident light.

Photodiodes 322 for the pixel sensors 202 in the pixel array 200 may be formed in the substrate layer 320. A photodiode 322 may include a region of the substrate layer 320 that is doped with a plurality of types of ions to form a p-n junction or a PIN junction (e.g., a junction between a p-type portion, an intrinsic (or undoped) type portion, and an n-type portion). For example, the substrate layer 320 may be doped with an n-type dopant to form a first portion (e.g., an n-type portion) of a photodiode 322 and a p-type dopant to form a second portion (e.g., a p-type portion) of the photodiode 322. A photodiode 322 may be configured to absorb photons of incident light. The absorption of photons causes a photodiode 322 to accumulate a charge (referred to as a photocurrent) due to the photoelectric effect. Here, photons bombard the photodiode 322, which causes emission of electrons of the photodiode 322. The emission of electrons causes the formation of electron-hole pairs, where the electrons migrate toward the cathode of the photodiode 322 and the holes migrate toward the anode, which produces the photocurrent.

A plurality of deep trench isolation (DTI) structures 324 may be included in the substrate layer 320. In particular, DTI structures 324 may be formed between each of the photodiodes 322 of the pixel sensors 202 such that the photodiodes 322 are surrounded by DTI structures 324. As an example, a DTI structure 324 may be formed between the photodiode 322 of the pixel sensor 202a and the pixel sensor 202b, a DTI structure 324 may be formed between the photodiode 322 of the pixel sensor 202a and an adjacent pixel sensor, a DTI structure 324 may be formed between the photodiode 322 of the pixel sensor 202b and an adjacent pixel sensor, and so on. The DTI structures 324 may form a grid layout in which DTI structures 324 extend laterally across the pixel array 200 and intersect at various locations of the pixel array 200. In some implementations, the DTI structure 324 may be backside DTI (BDTI) structures formed as a part of back side processing of the optoelectronic device 300.

The DTI structures 324 may include trenches (e.g., deep trenches) that extend downward into the substrate layer 320 along the photodiodes 322. The DTI structures 324 may provide optical isolation between the pixel sensors 202 of the pixel array 200 to reduce the amount of optical crosstalk between adjacent pixel sensors 202. In particular, DTI structures 324 may absorb, refract, and/or reflect incident light, which may reduce the amount of incident light that travels through a pixel sensor 202 into an adjacent pixel sensor 202 and is absorbed by the adjacent pixel sensor 202.

One or more high absorption (HA) regions 326 may be located in the substrate layer 320, and in and/or above one or more photodiodes 322. Each HA region 326 may be defined by a shallow trench. One or more HA regions 326 may be formed in a same side of the substrate layer 320 as the DTI structures 324.

The HA regions 326 may increase the absorption of incident light for a pixel sensor 202 (thereby increasing the quantum efficiency of the pixel sensor 202) by modifying or changing the orientation of the refractive interface between the photodiode 322 of the pixel sensor 202 and the substrate layer 320. Angled surfaces of HA structures within the HA regions 326 change the orientation of the interface between the photodiode 322 and the substrate layer 320 by causing the interface to be diagonal relative to the orientation of a top surface of the substrate layer 320. This change in orientation may result in a smaller angle of refraction relative to a flat surface of the top surface of the substrate layer 320 for the same angle of incidence of incident light.

As an example, and as described in greater detail in connection with FIG. 3B, a field of HA structures 328a may include adjacent HA structures having inverted triangle-shaped profiles. The field of HA structures 328a may, as shown in FIG. 3A, penetrate into the photodiode 322. Additionally, or alternatively, the field of HA structures 328a may penetrate into the substrate layer 320.

Additionally, or alternatively and as described in greater detail in connection with FIG. 3C, a field of HA structures 328b may include adjacent HA structures having inverted trapezoid-shaped profiles, where a plateau region 330 is immediately and horizontally between the adjacent HA structures. The field of HA structures 328b may, as shown in FIG. 3A, penetrate into the photodiode 322. Additionally, or alternatively, the field of HA structures 328b may penetrate into the substrate layer 320.

Additionally, or alternatively and as described in greater detail in connection with FIG. 3D, a field of HA structures 328c may include adjacent HA structures having inverted trapezoid-shaped profiles, where the plateau region 330 is immediately and horizontally between the two HA structures. The field of HA structures 328c may, as shown in FIG. 3A, penetrate into the photodiode 322. Additionally, or alternatively, the field of HA structures 328c may penetrate into the substrate layer 320.

The top surface of the substrate layer 320, the surfaces of the DTI structures 324, and the surfaces of the HA region(s) 326 (e.g., the fields of HA structures 328a, 328b, and/or 328c) may be coated with an antireflective coating (ARC) layer 332 to decrease reflection of incident light away from the photodiodes 322 and to increase transmission of incident light into the substrate layer 320 and the photodiodes 322. The ARC layer 332 may include a suitable material for reducing a reflection of incident light projected toward the photodiodes 322, such as a nitrogen-containing material or other examples.

An oxide layer 334 may be located above the substrate layer 320 and above and/or on the ARC layer 332. Moreover, the material of the oxide layer 334 may fill the DTI structures 324 and the HA regions 326. The oxide layer 334 may function as a passivation layer between the substrate layer 320 and the upper layers of the pixel array 200. In some implementations, the oxide layer 334 includes an oxide material such as a silicon oxide (SiO$_x$). In some implementations, a silicon nitride (SiN$_x$), a silicon carbide (SiC$_x$), or a mixture thereof, such as a silicon carbon nitride (SiCN), a silicon oxynitride (SiON), or another dielectric material is used in place of the oxide layer 334 as a passivation layer.

A metal shielding layer 336 may be located above and/or on the oxide layer 334 (or portions thereof). The metal shielding layer 336 may provide shielding for the components and/or devices formed in the metal shield region 302. The metal shielding layer 336 may be formed of a metal material, such as gold, silver, aluminum, a metal alloy, or a similar metal. One or more passivation layers may be formed above and/or on the metal shielding layer 336. For example, a BSI oxide layer 338 may be located above and/or on portions of the oxide layer 334, and above and/or on the metal shielding layer 336. As another example, a buffer oxide layer 340 may be located above and/or on the BSI oxide layer 338. In some implementations, the BSI oxide layer 338 and/or the buffer oxide layer 340 include an oxide material such as a silicon oxide (SiO$_x$). In some implementations, a silicon nitride (SiN$_x$), a silicon carbide (SiC$_x$), or a mixture thereof, such as a silicon carbon nitride (SiCN), a silicon oxynitride (SiON), or another dielectric material is used in place of the BSI oxide layer 338 and/or the buffer oxide layer 340 as a passivation layer.

A filter layer 342 may be included above and/or on the buffer oxide layer 340 for one or more pixel sensors 202 in the pixel array 200. The filter layer 342 may include one or more visible light color filter regions configured to filter particular wavelengths or wavelength ranges of visible light (e.g., that permit particular wavelengths or wavelength ranges of visible light to pass through the filter layer 342), one or more near infrared (NIR) filter regions (e.g., NIR bandpass filter regions) configured to permit wavelengths associated with NIR light to pass through the filter layer 342 and to block other wavelengths of light, one or more NIR cut filter regions configured to block NIR light from passing through the filter layer 342, and/or other types of filter regions. In some implementations, one or more pixel sensors 202 in the pixel array 200 are each configured with a filter region of the filter layer 342. For example, the pixel sensor 202a may be configured with a filter region 342a above the photodiode 322 of the pixel sensor 202a, the pixel sensor 202b may be configured with a filter region 342b above the photodiode 322 of the pixel sensor 202b, and so on. In some implementations, filter regions may be omitted from the filter layer 342 for one or more pixel sensors 202 in the pixel array 200 to permit all wavelengths of light to pass through the filter layer 342 for one or more pixel sensors 202. In these examples, one or more pixel sensors 202 may be configured as white pixel sensors.

A micro-lens layer 344 may be included above and/or on the filter layer 342. The micro-lens layer 344 may include a plurality of micro-lenses. In particular, the micro-lens layer 344 may include a respective micro-lens for each of the pixel sensors 202 included in the pixel array 200. For example, a first micro-lens may be formed to focus incident light toward the photodiode 322 of pixel sensor 202a, a second micro-lens may be formed to focus incident light toward the photodiode 322 of pixel sensor 202b, and so on.

As shown in the bonding pad region 304 of the optoelectronic device 300, a shallow trench isolation (STI) structure 346 may be located above and/or on the ILD layer 318 in the bonding pad region 304. The STI structure 346 may provide electrical isolation in the bonding pad region 304. For example, the STI structure 346 may electrically isolate the pixel array 200 and/or the metal shield region 302 from other regions of the optoelectronic device 300 and/or from other devices formed on the same semiconductor die as the optoelectronic device 300. In some implementations, the buffer oxide layer 340 may be located above and/or on the STI structure 346 in the bonding pad region 304.

A bonding pad 348 may be located in the bonding pad region 304 above the STI structure 346, and/or above and/or on the buffer oxide layer 340. The bonding pad 348 may extend through the buffer oxide layer 340, through the STI structure 346, and through the ILD layer 318 to the IMD layer 310, and may contact one or more metallization layers 312 in the IMD layer 310. The bonding pad 348 may include a conductive material, such as gold, silver, aluminum, copper, aluminum-copper, titanium, tantalum, titanium nitride, tantalum nitride, tungsten, a metal alloy, other metals, or a combination thereof. The bonding pad 348 may provide electrical connections between the metallization layers 312 of the optoelectronic device 300 and external devices and/or external packaging.

Figure 3B:
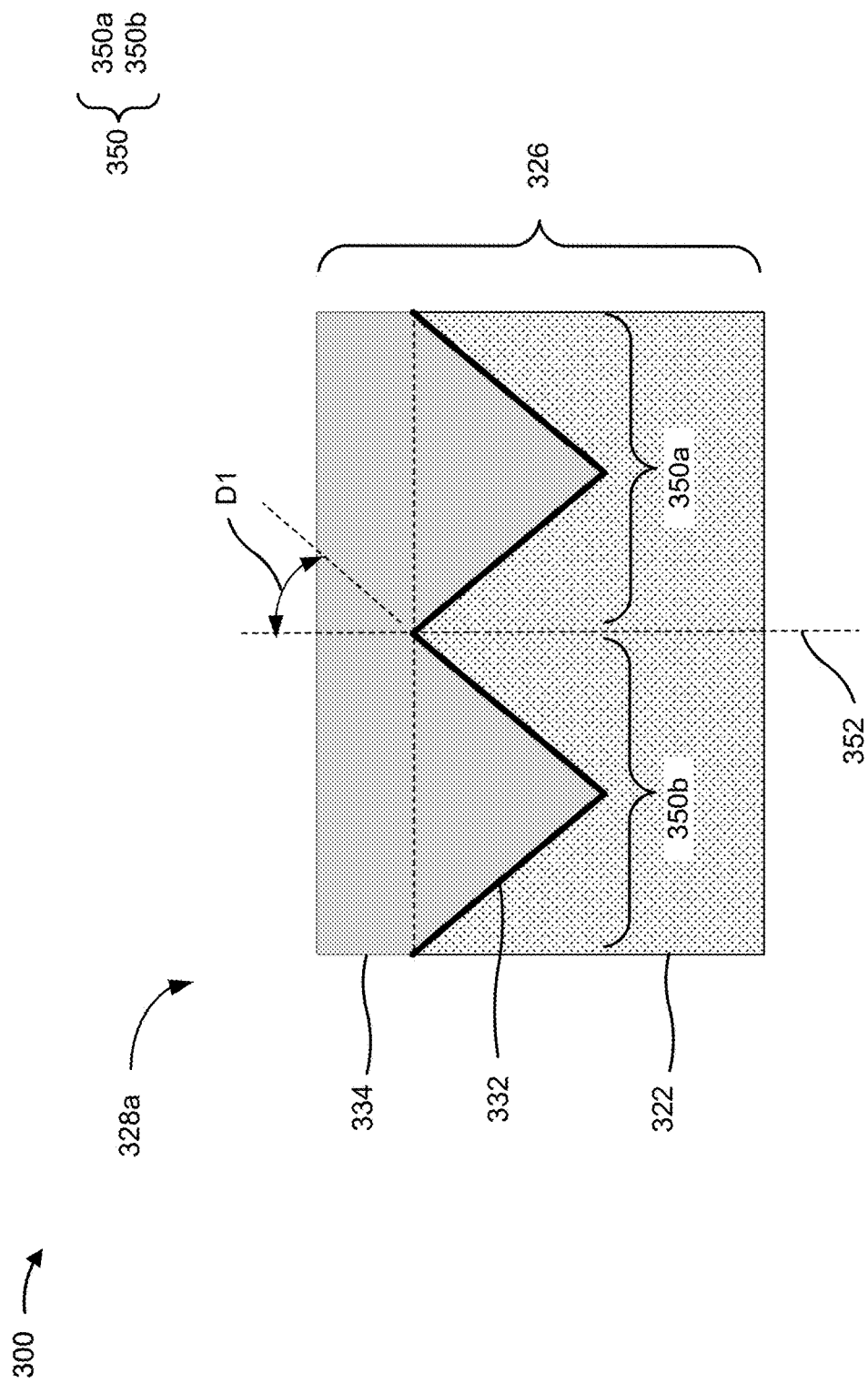

FIG. 3B shows details of the field of HA structures 328a that may be included in the HA region 326. As shown in FIG. 3B, the field of HA structures 328a includes an HA structure 350a that is adjacent to an HA structure 350b. In some implementations, the HA structure 350a and the HA structure 350b are symmetric about a central axis 352. In some implementations, surfaces of the HA structure 350a and/or the HA structure 350b penetrate into the photodiode 322 (and/or the substrate layer 320) at an angle D1. As an example, the angle D1 may be included in a range of approximately 50 degrees to approximately 60 degrees. If the angle D1 is less than approximately 50 degrees, or greater than approximately 60 degrees, an efficiency of the HA structure 350a and/or the HA structure 350b to absorb energy (e.g., incident light) may be reduced. However, other values and ranges for the angle D1 are within the scope of the present disclosure.

In some implementations, the HA structure 350a and/or the HA structure 350b include an inverted triangle-shaped profile. In such cases, the HA structure 350a and/or the HA structure 350b may correspond to an inverted pyramid-shape. Additionally, or alternatively, the HA structure 350a and/or the HA structure 350b may correspond to an inverted conical-shape.

The HA structure 350a and/or the HA structure 350b may include portions of the photodiode 322. Additionally, or alternatively, the HA structure 350a and/or the HA structure 350b may include portions of the oxide layer 334. Additionally, or alternatively, the HA structure 350a and/or the HA structure 350b may include portions of the ARC layer 332.

Figure 3C:
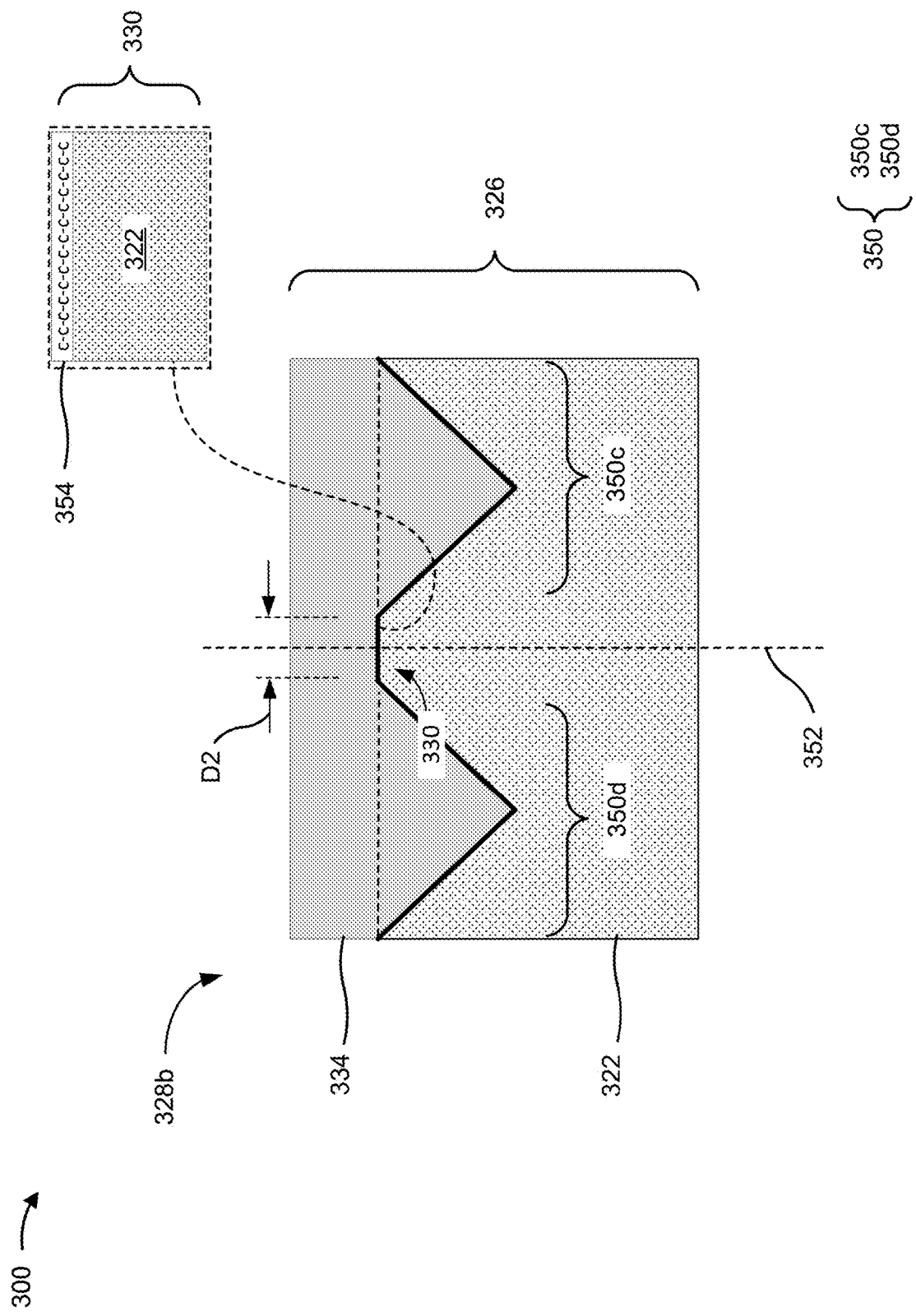

FIG. 3C shows details of the field of HA structures 328b that may be included in the HA region 326. As shown in FIG. 3C, the field of HA structures 328b includes an HA structure 350c that is adjacent to an HA structure 350d. In some implementations, surfaces of the HA structure 350c and/or the HA structure 350d penetrate into the photodiode 322 (and/or the substrate layer 320).

In some implementations, the HA structure 350c and/or the HA structure 350d include an inverted triangle-shaped profile. In such cases, the HA structure 350c and/or the HA structure 350d may correspond to an inverted pyramid-shape. Additionally, or alternatively, the HA structure 350c and/or the HA structure 350d may correspond to an inverted conical-shape.

The HA structure 350c and/or the HA structure 350d may include portions of the photodiode 322. Additionally, or alternatively, the HA structure 350c and/or the HA structure 350d may include portions of the oxide layer 334. Additionally, or alternatively, the HA structure 350c and/or the HA structure 350d may include portions of the ARC layer 332.

As further shown in FIG. 3C, the plateau region 330 is immediately and horizontally between the HA structure 350c and the HA structure 350d. In some implementations, the HA structure 350c and the HA structure 350d are symmetric about a central axis of the plateau region 330 (e.g., the central axis 352).

In some implementations, a width D2 of the plateau region may be included in a range of approximately 100 microns (µm) to approximately 500 µm. If the width D2 is less than approximately 100 µm, cavities used to form the HA structure 350c and/or the HA structure 350d may be over etched. Additionally, or alternatively, damage to a device including the HA structure 350c and/or the HA structure 350d (e.g., the optoelectronic device 300 including the photodiode 322 and/or the substrate layer 320) may occur. If the width is greater than approximately 500 µm, cavities used to form the HA structure 350c and/or the HA structure 350d may be under etched and a threshold for a performance (e.g., a QE performance) of the optoelectronic device may not be satisfied. However, other values and ranges for the width D2 are within the scope of the present disclosure.

As shown in the magnified view of the plateau region 330, a carbon layer 354 may be on a top surface of the photodiode 322 (and/or the substrate layer 320). As described in greater detail in connection with FIGS. 4E-4J, a dry etch process included in a series of operations to form the HA structure 350c and/or the HA structure 350d may include forming the carbon layer 354.

Figure 3D:
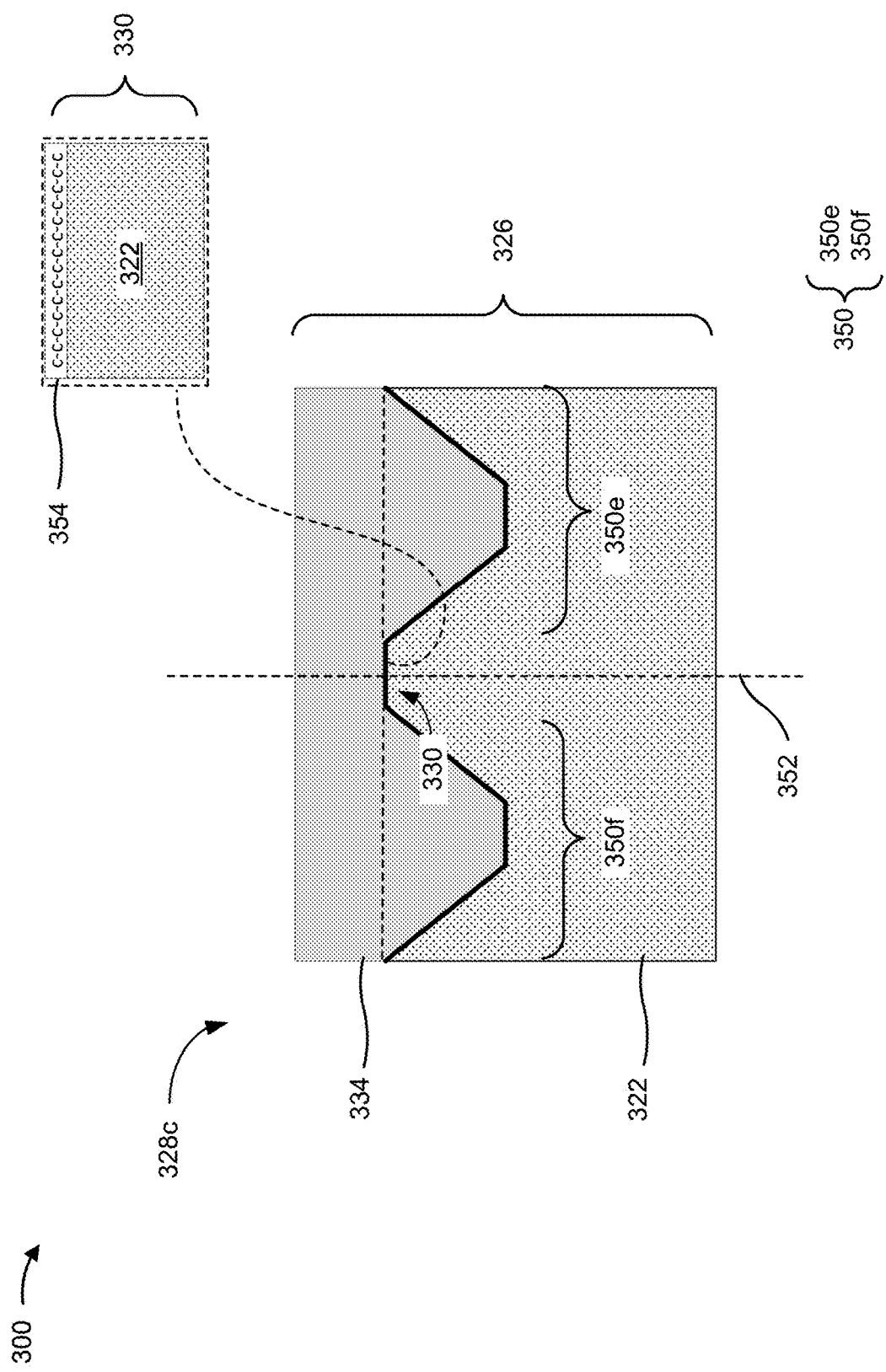

FIG. 3D shows details of the field of HA structures 328c that may be included in the HA region 326. As shown in FIG. 3D, the field of HA structures 328c include an HA structure 350e that is adjacent to an HA structure 350f. In some implementations, surfaces of the HA structure 350e and/or the HA structure 350f penetrate into the photodiode 322 (and/or the substrate layer 320).

In some implementations, the HA structure 352e and/or the HA structure 350f include an inverted trapezoid-shaped profile. In such cases, the HA structure 352e and/or the HA structure 350f may correspond to an inverted, truncated pyramid-shape. Additionally, or alternatively, the HA structure 352e and/or the HA structure 350f may correspond to an inverted, truncated conical-shape. As described in greater detail in connection with FIGS. 4E-4J, a depth of the HA structure 352e and/or the HA structure 350e (e.g., a depth of truncation) may be dependent on a length of a wet etch process used to form a cavity of the HA structure 352e and/or the HA structure 350f.

The HA structure 352e and/or the HA structure 350f may include portions of the photodiode 322. Additionally, or alternatively, the HA structure 352e and/or the HA structure 350f may include portions of the oxide layer 334. Additionally, or alternatively, the HA structure 350e and/or the HA structure 350e may include portions of the ARC layer 332.

As further shown in FIG. 3D, the plateau region 330 is immediately and horizontally between the HA structure 350e and the HA structure 350f. In some implementations, the HA structure 350e and the HA structure 350f are symmetric about a central axis of the plateau region 330 (e.g., the central axis 352). As shown in the magnified view of the plateau region 330, the carbon layer 354 may be on the top surface of the photodiode 322 (and/or the substrate layer 320).

As described in connection with FIGS. 3A-3D, an optoelectronic device (e.g., the optoelectronic device 300) may include a first HA structure (e.g., the HA structure 350c) penetrating into a semiconductor substrate (e.g., the substrate layer 320 and/or the photodiode 322). The optoelectronic device includes a second high absorption structure (e.g., the HA structure 350d) penetrating into the semiconductor substrate and adjacent to the first high absorption structure. The optoelectronic device includes a plateau region (e.g., the plateau region 330) including a carbon layer (e.g., the carbon layer 354), where the plateau region is immediately and horizontally between the first high absorption structure and the second high absorption structure The number and arrangement of components, structures, and/or layers shown in the optoelectronic device 300 of FIGS. 3A-3D are provided as an example. In practice, the optoelectronic device 300 may include additional components, structures, and/or layers; fewer components, structures, and/or layers; different components, structures, and/or layers; and/or differently arranged components, structures, and/or layers than those shown in FIGS. 3A-3D.

Figure 4A:
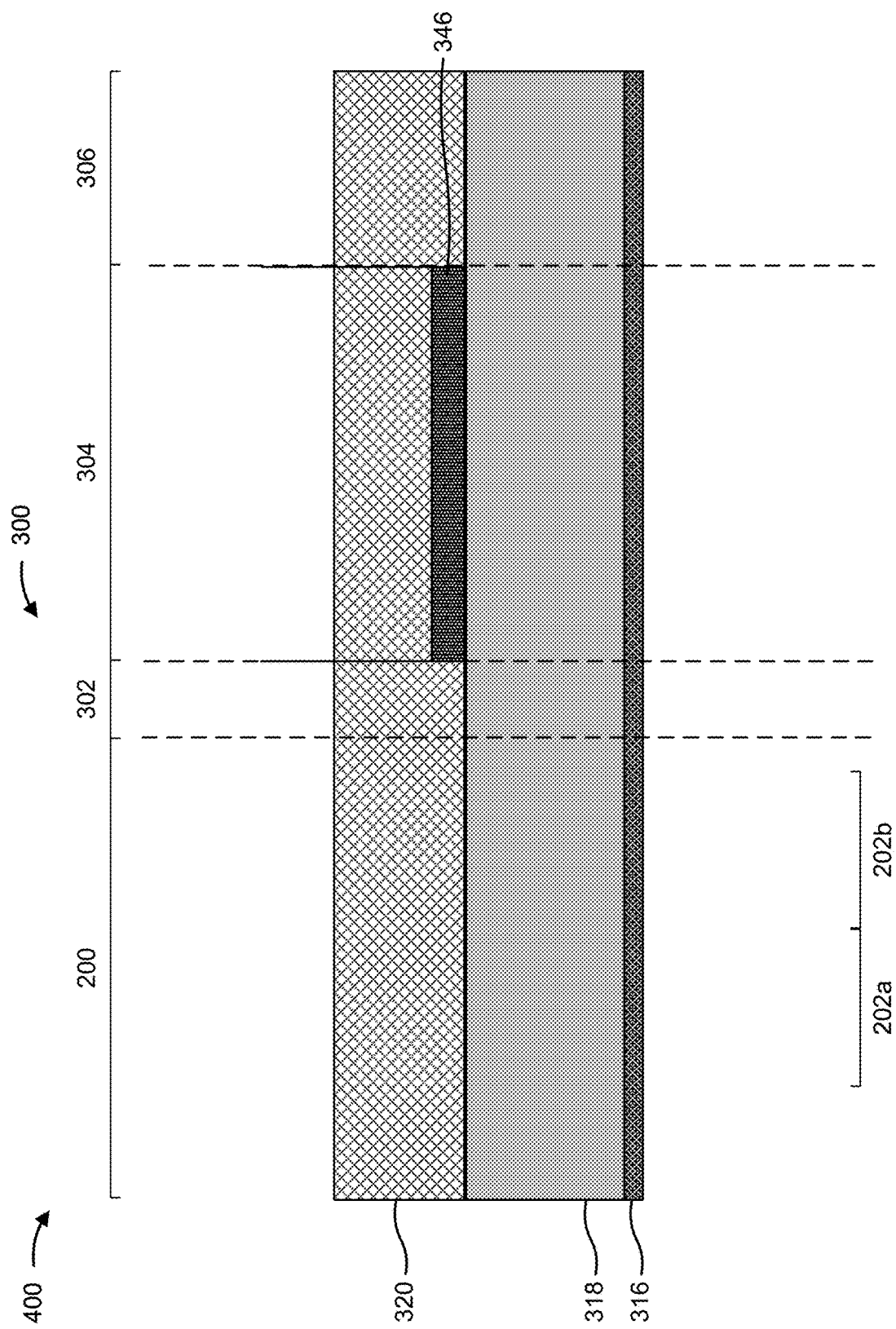
FIGS. 4A-4W are diagrams of an example manufacturing flow for forming the image sensor including the high absorption structure described herein.
Figure 4B:
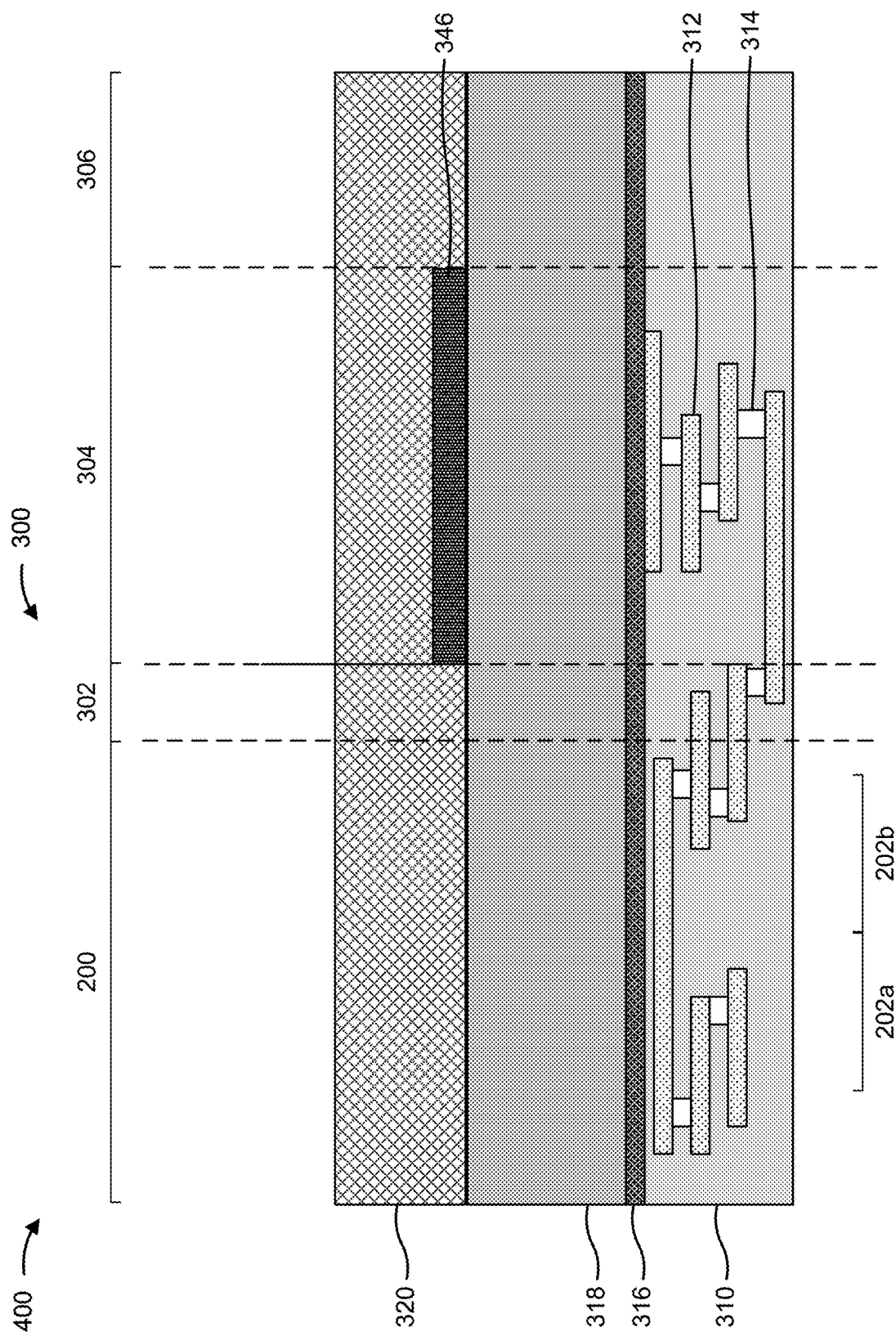
Figure 4C:
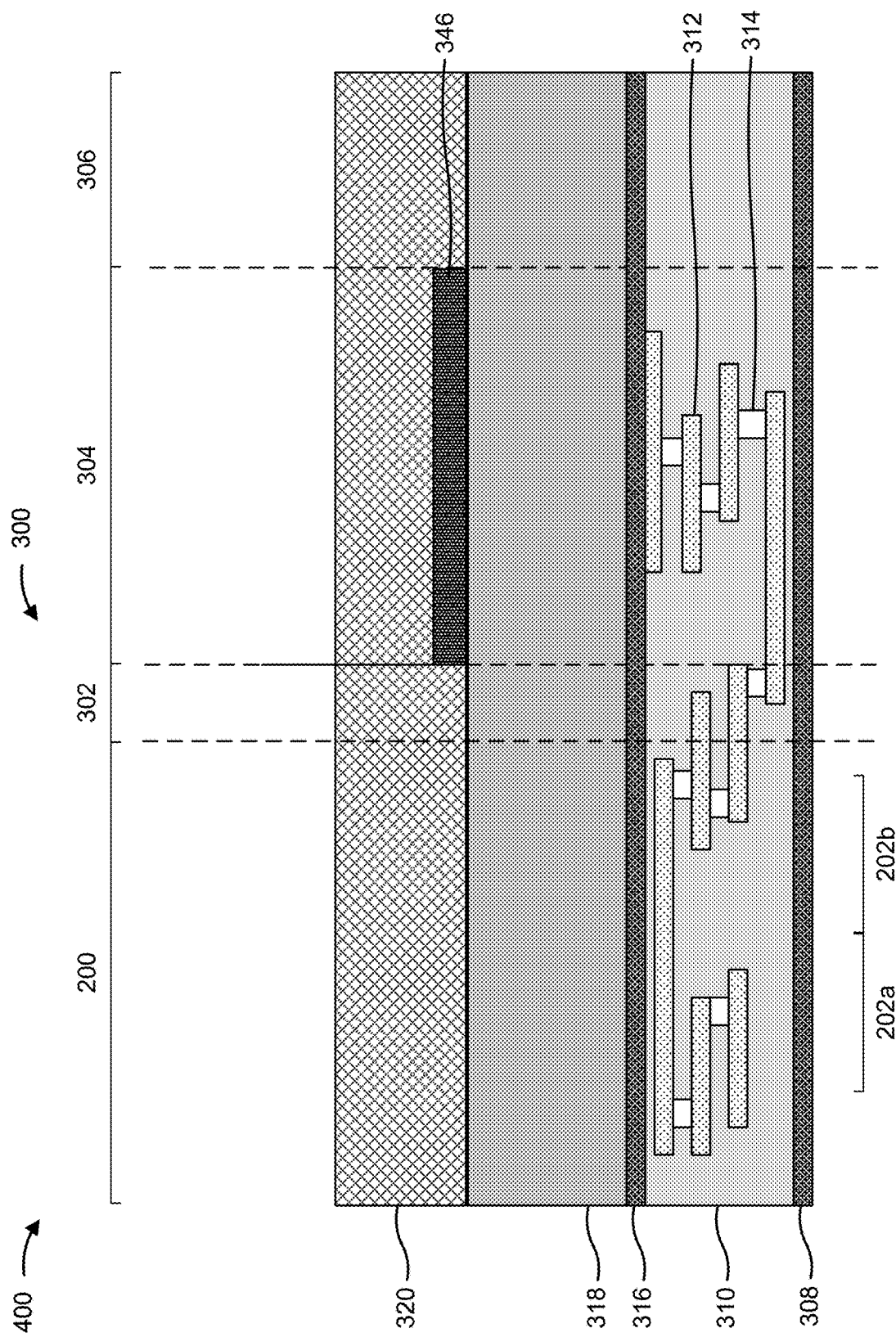
Figure 4D:
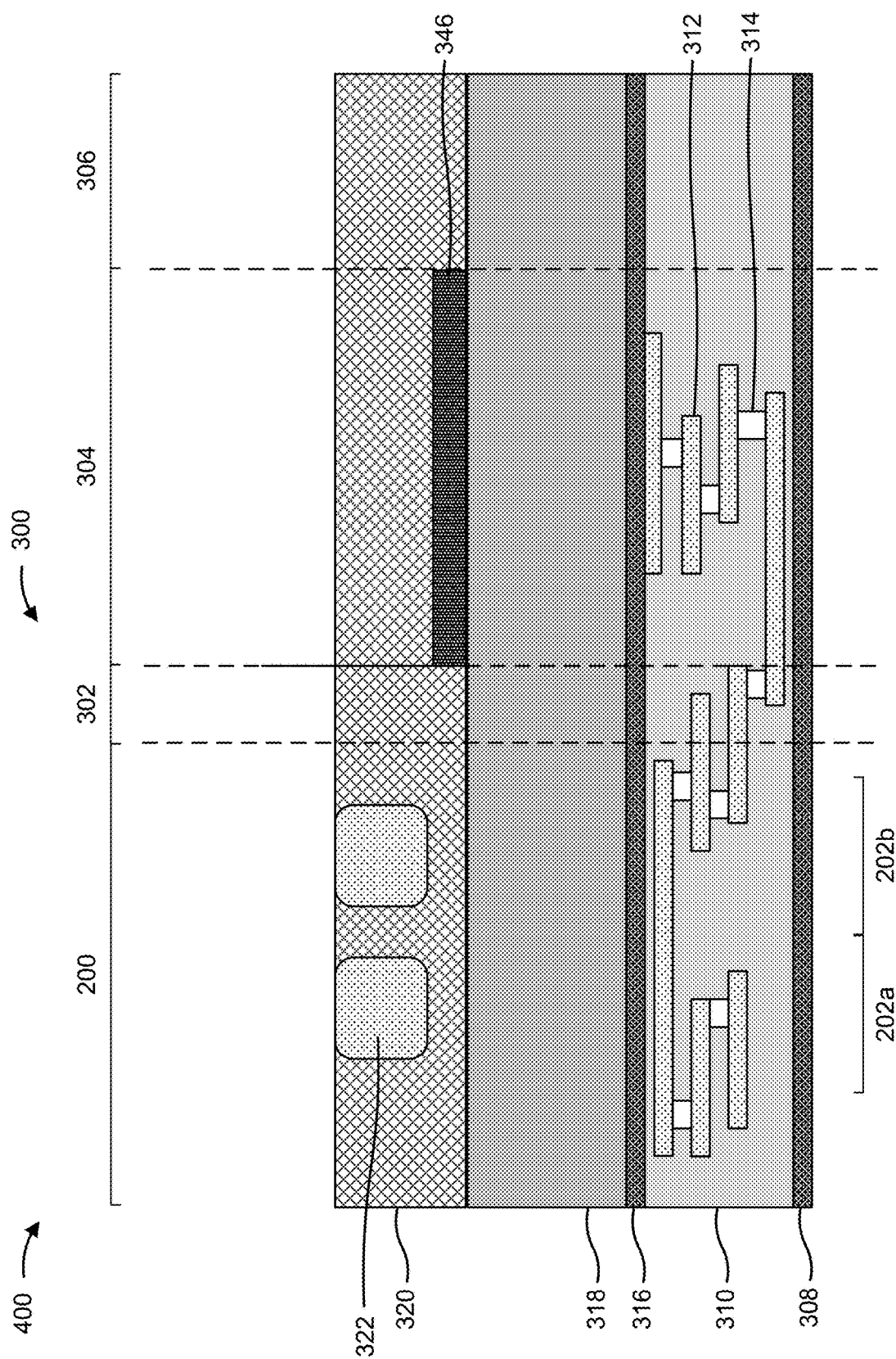
Figure 4E:
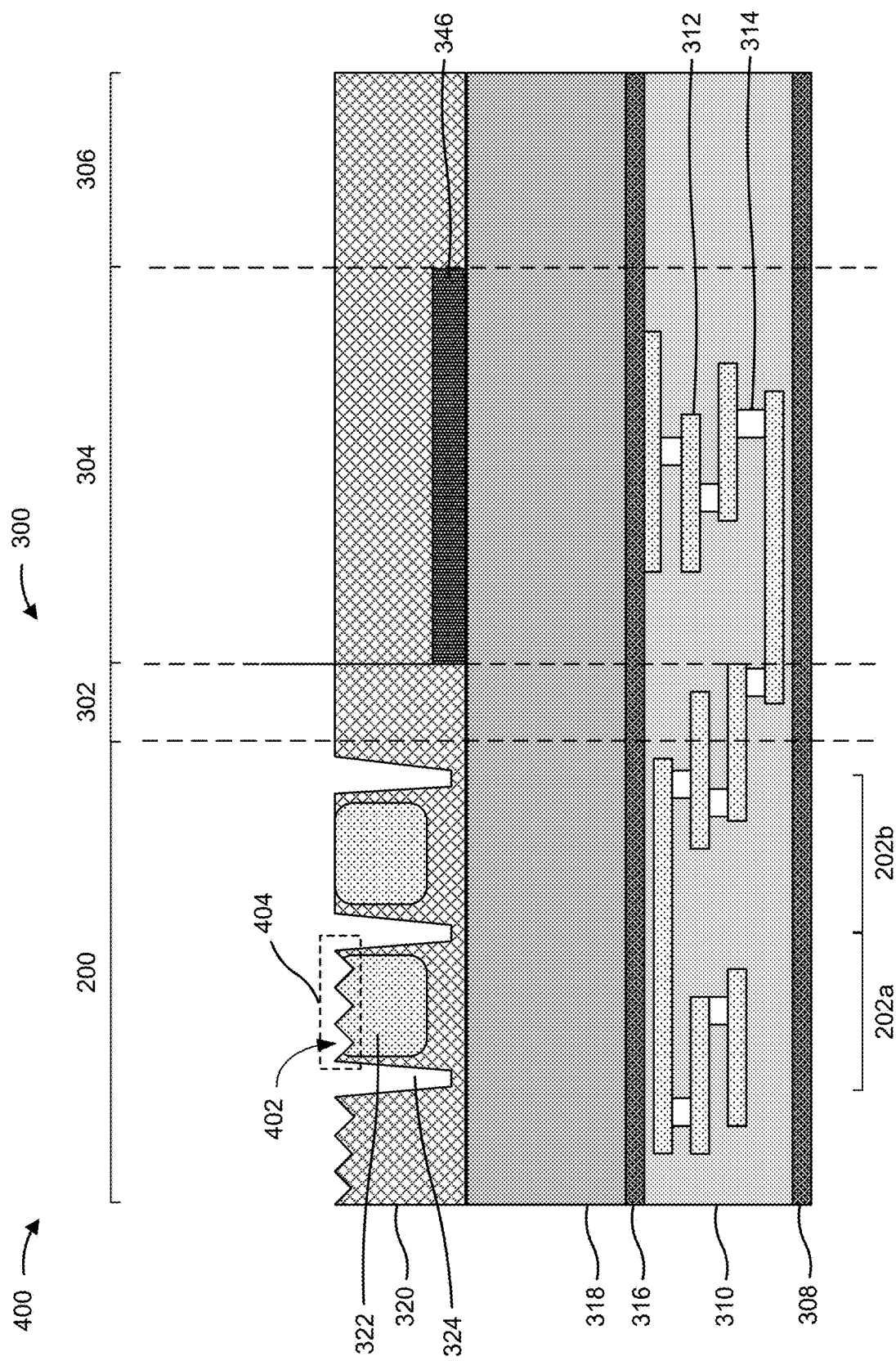
Figure 4F:
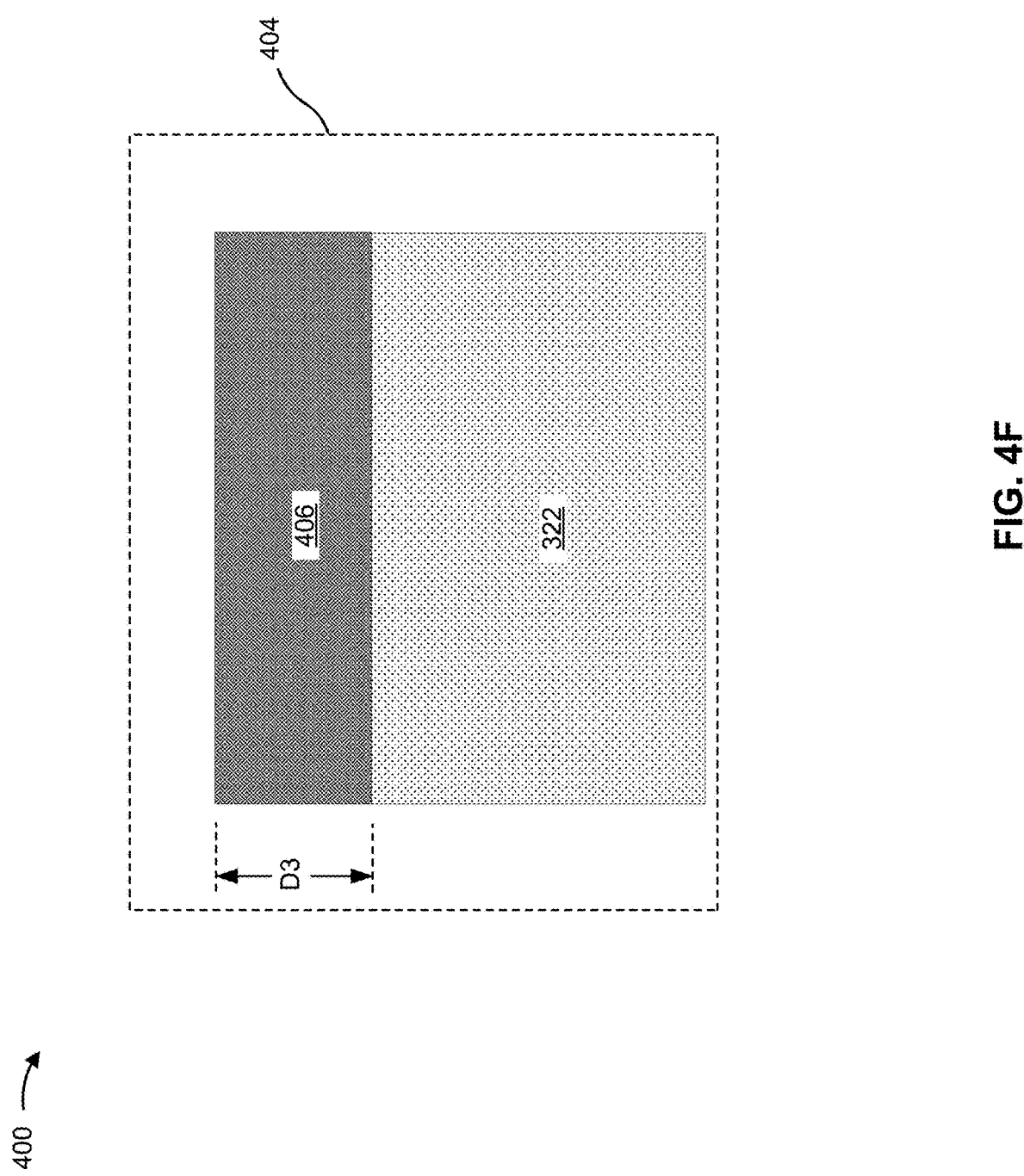
Figure 4G:
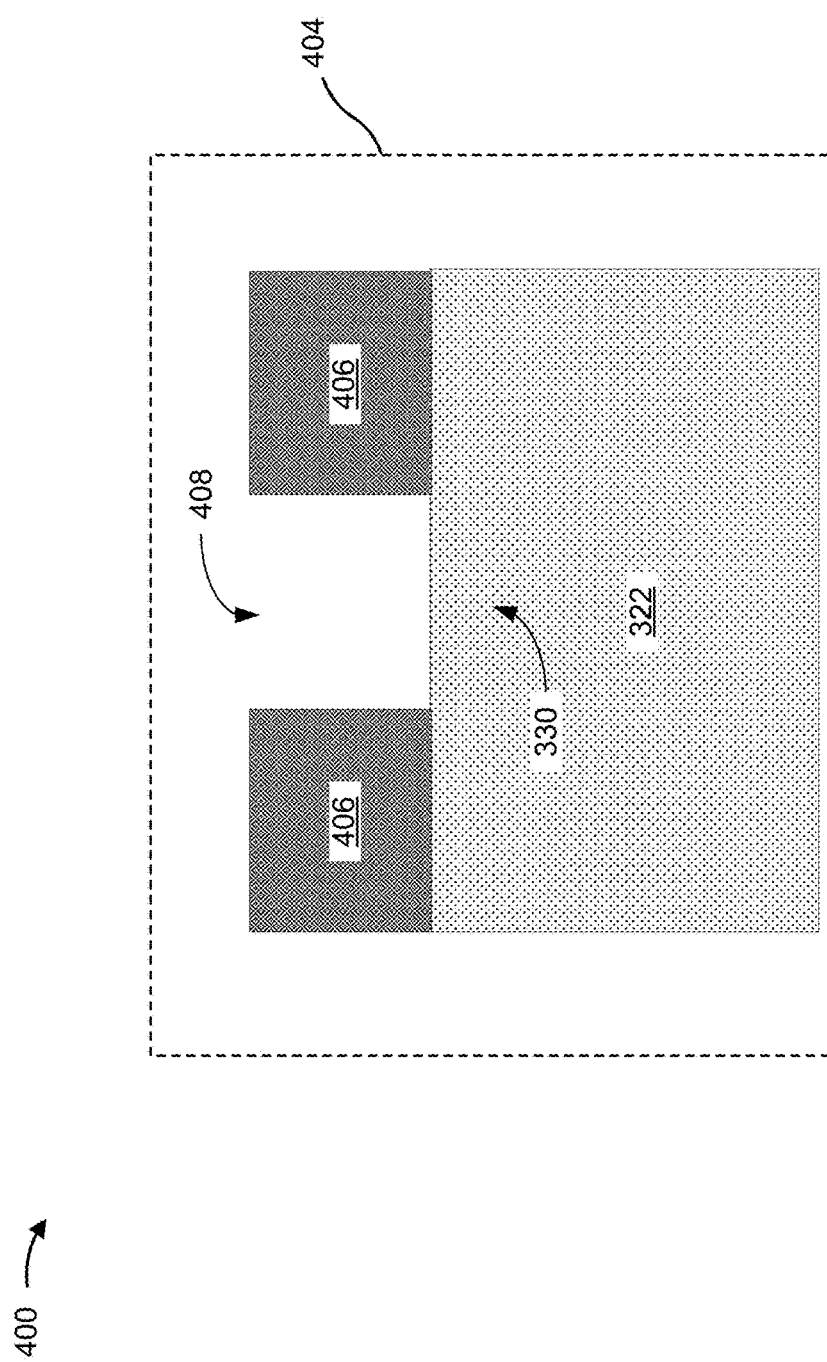
Figure 4H:
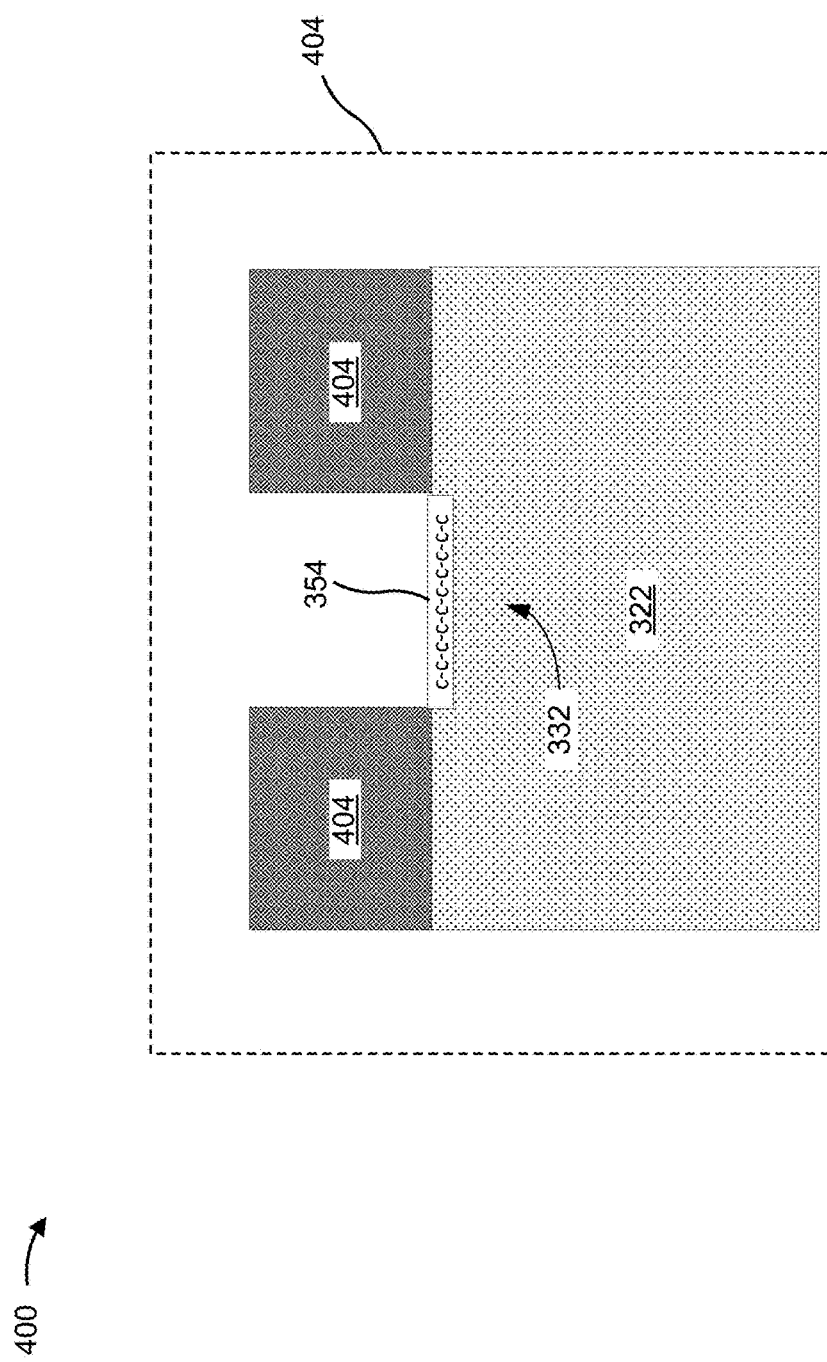
Figure 4I:
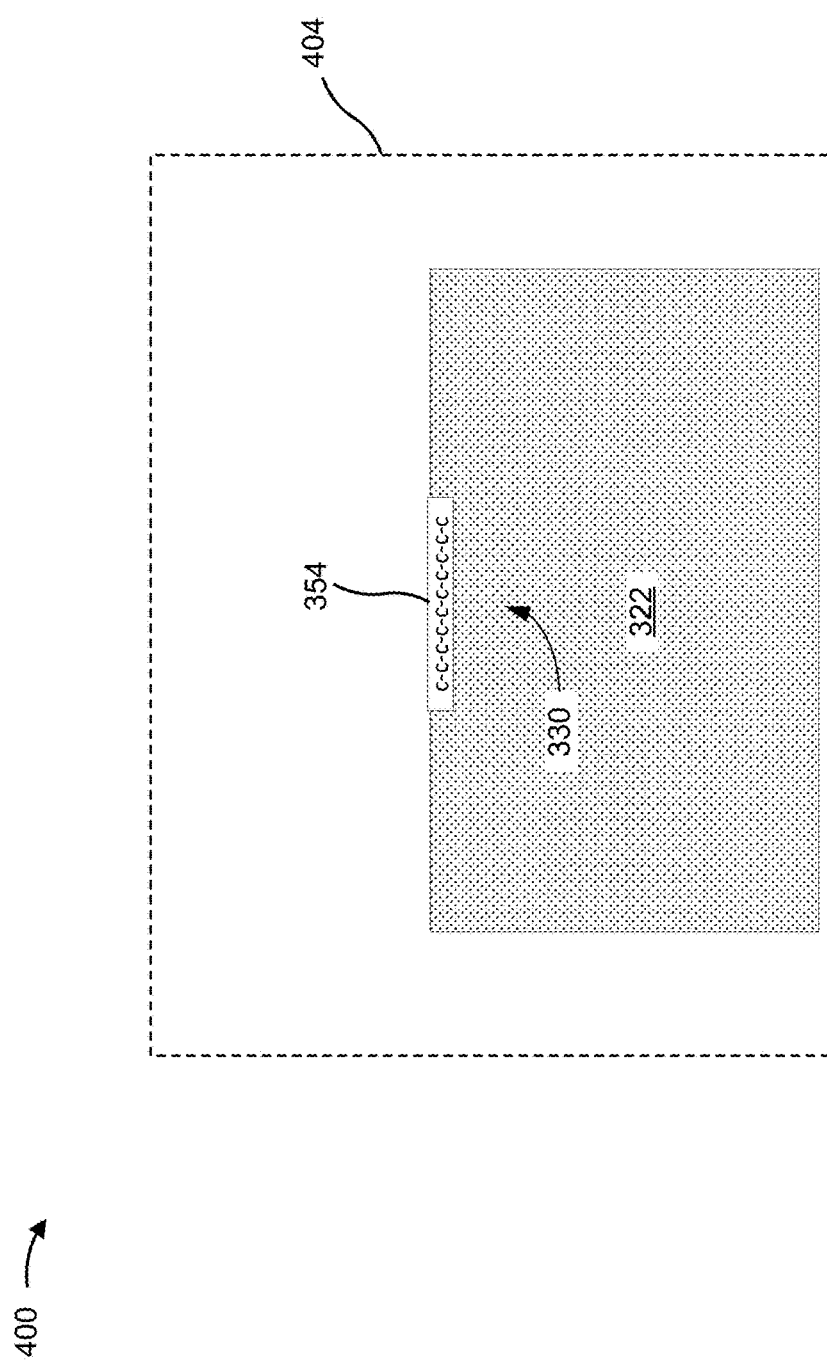
Figure 4J:
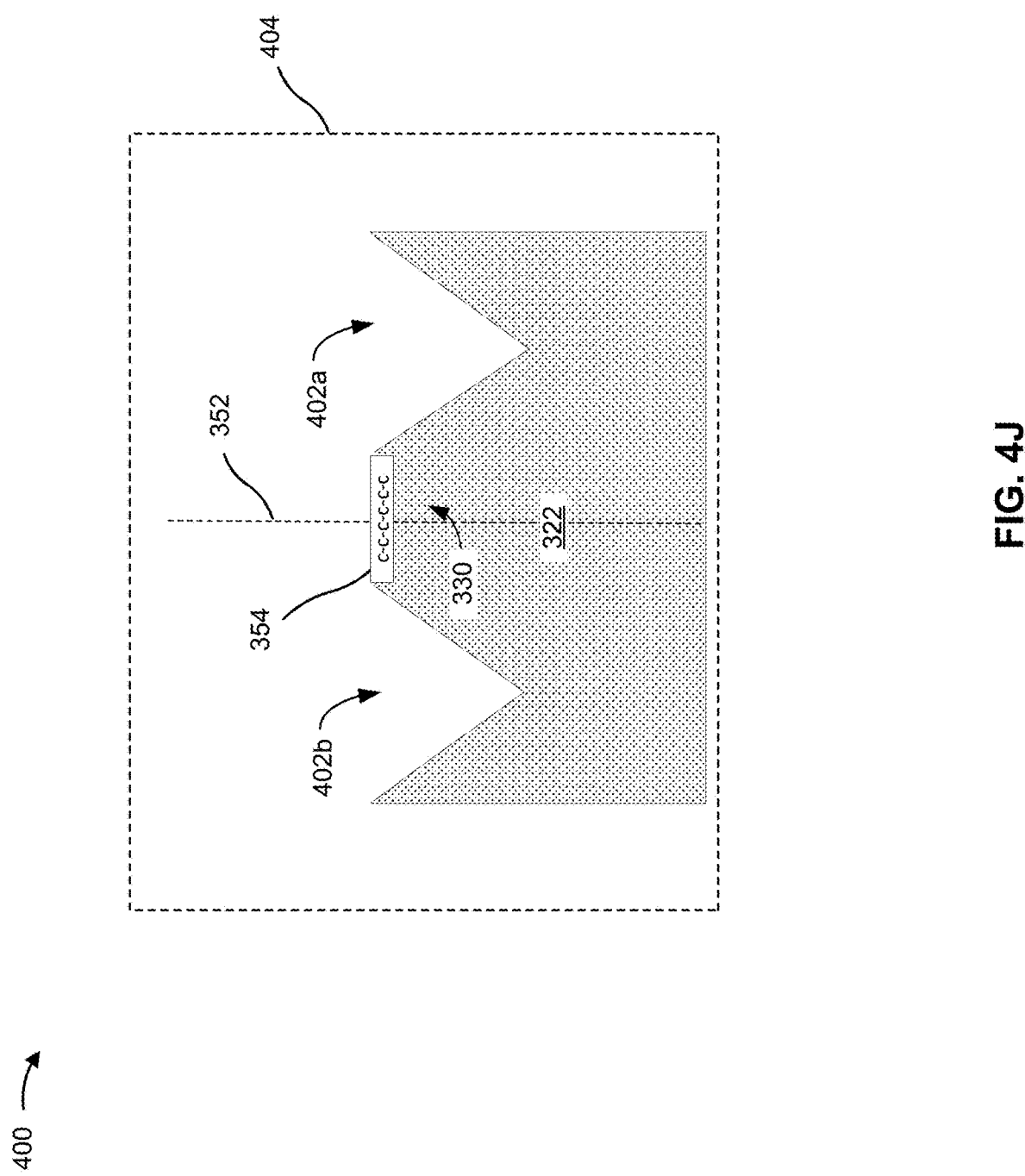
Figure 4K:
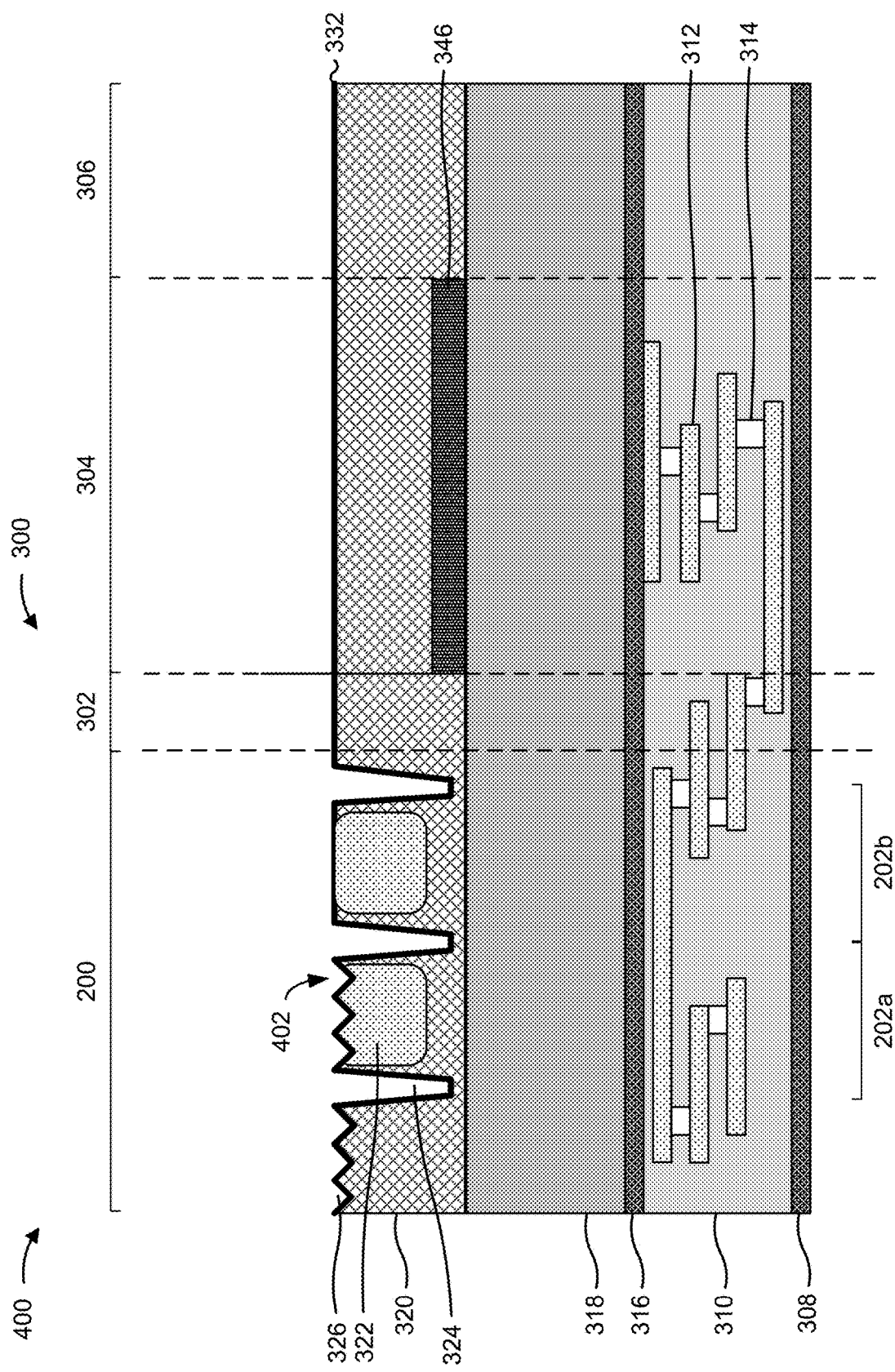
Figure 4L:
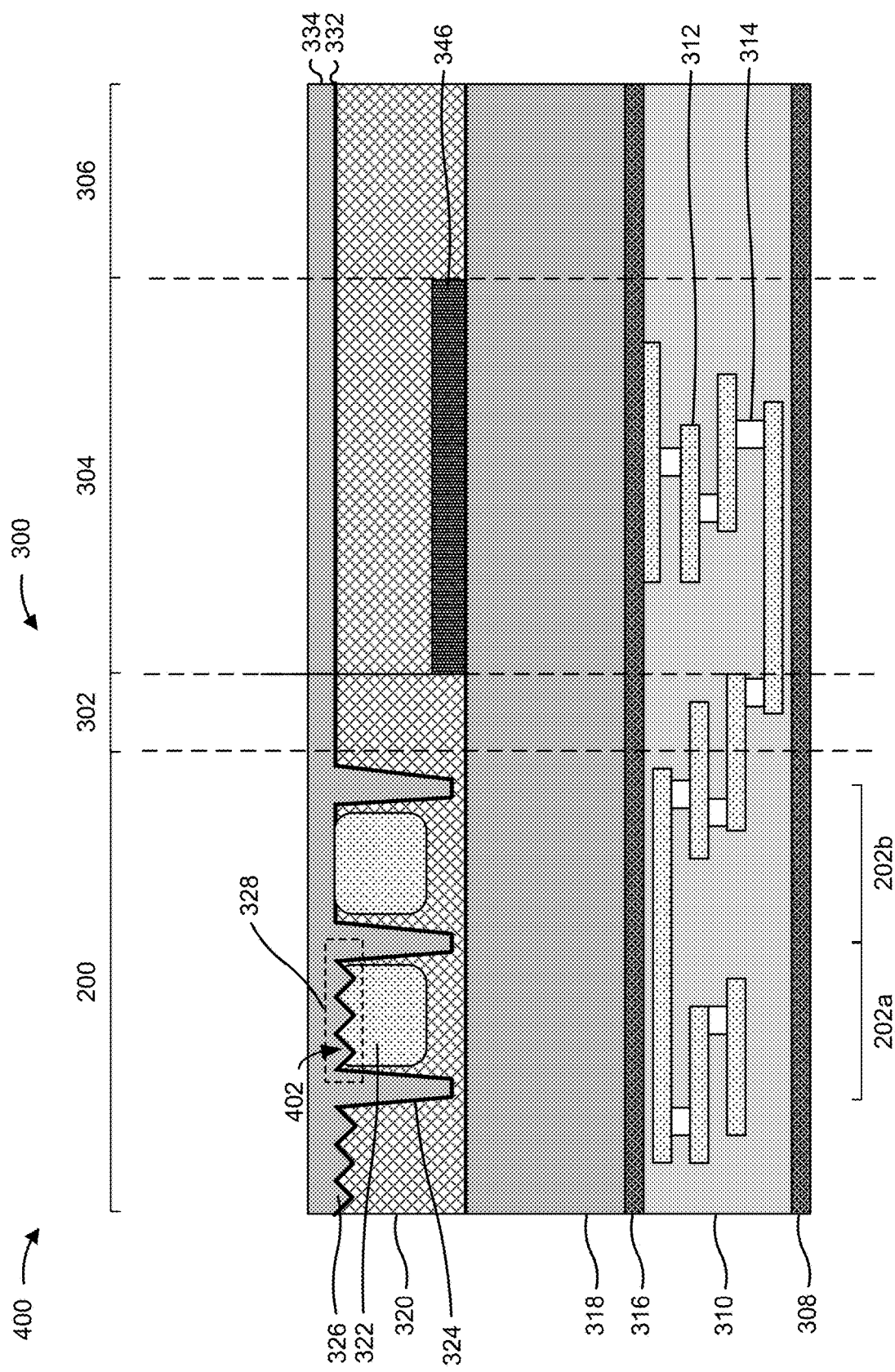
Figure 4M:
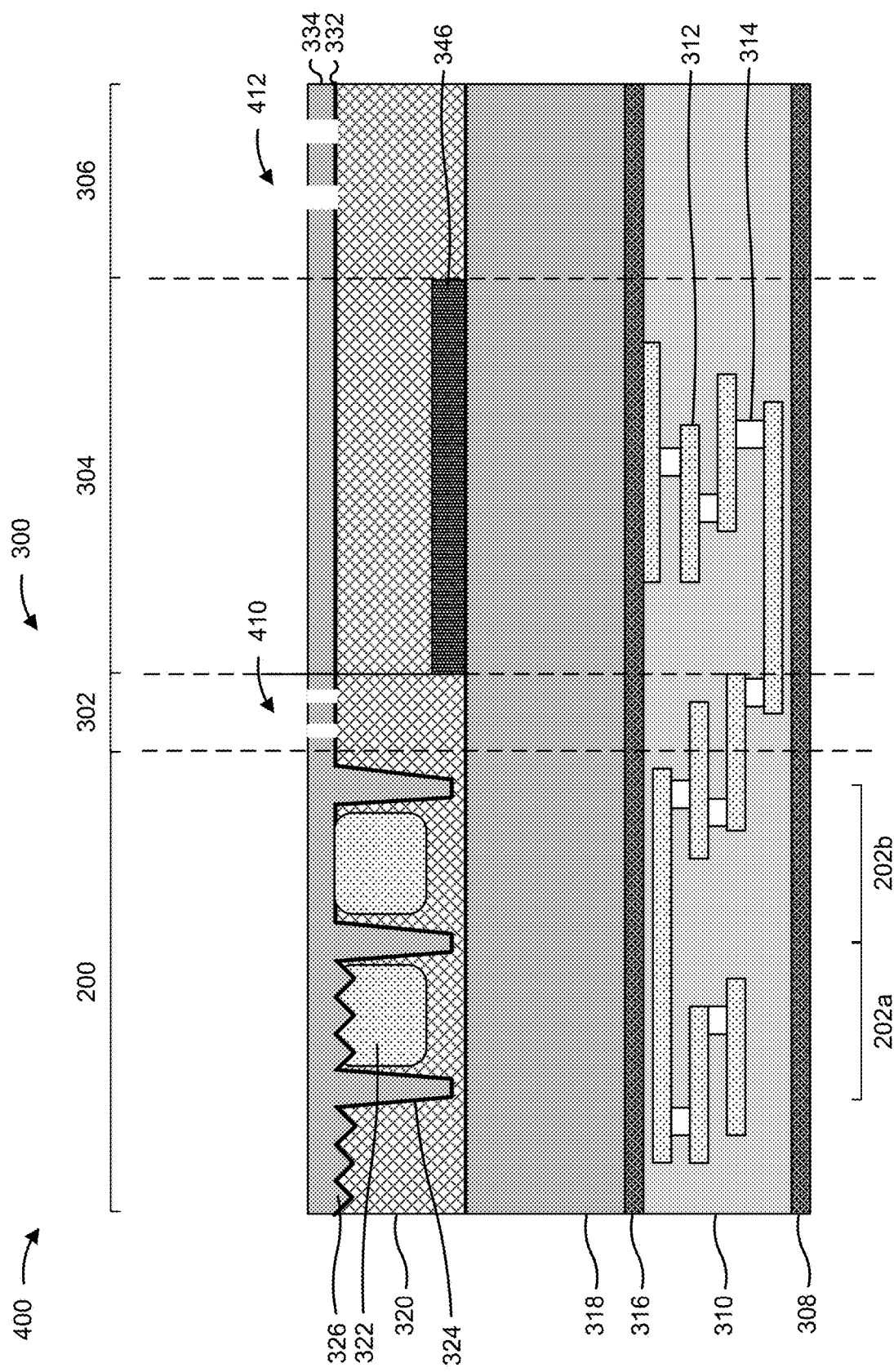
Figure 4N:
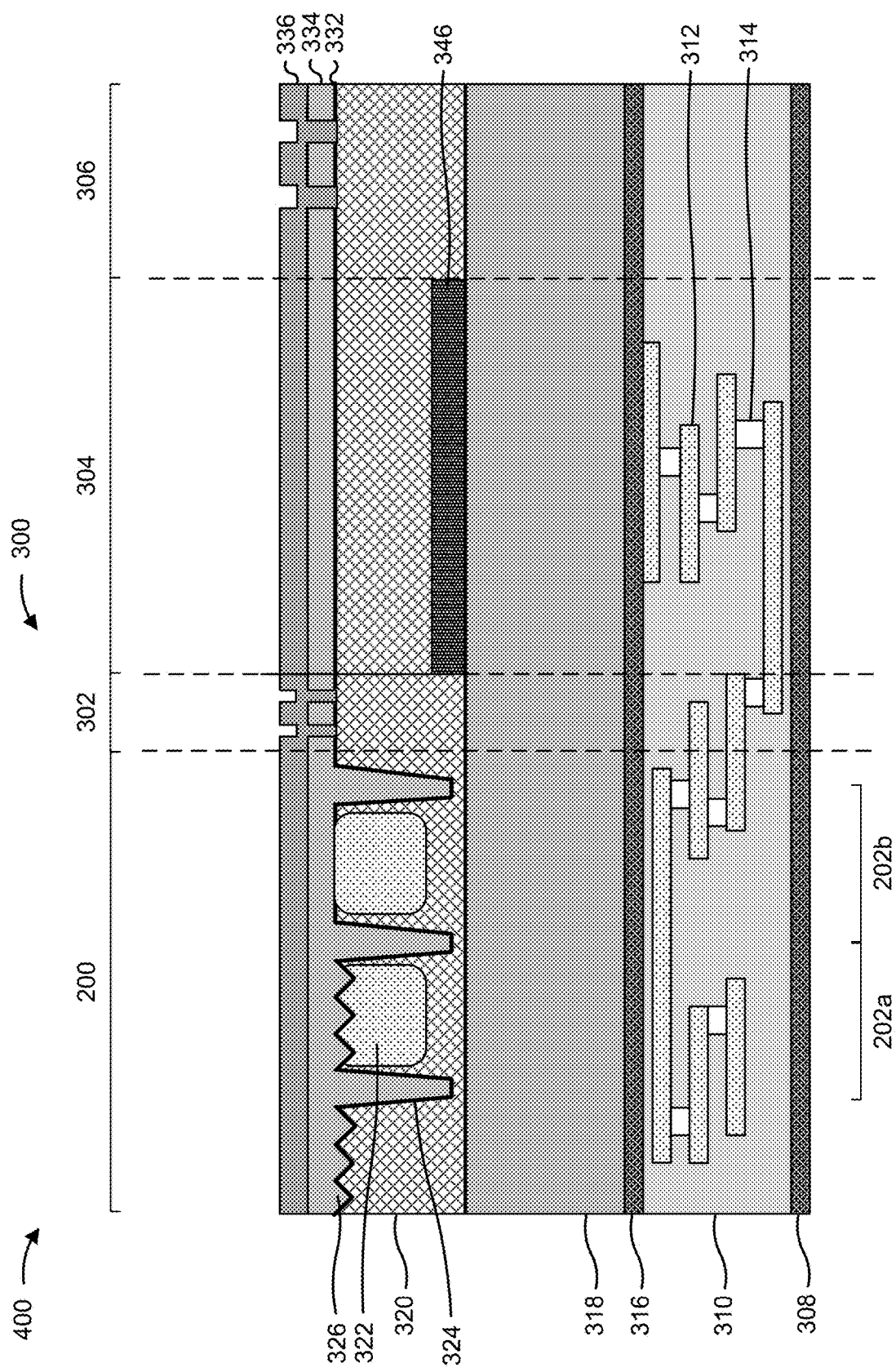
Figure 4O:
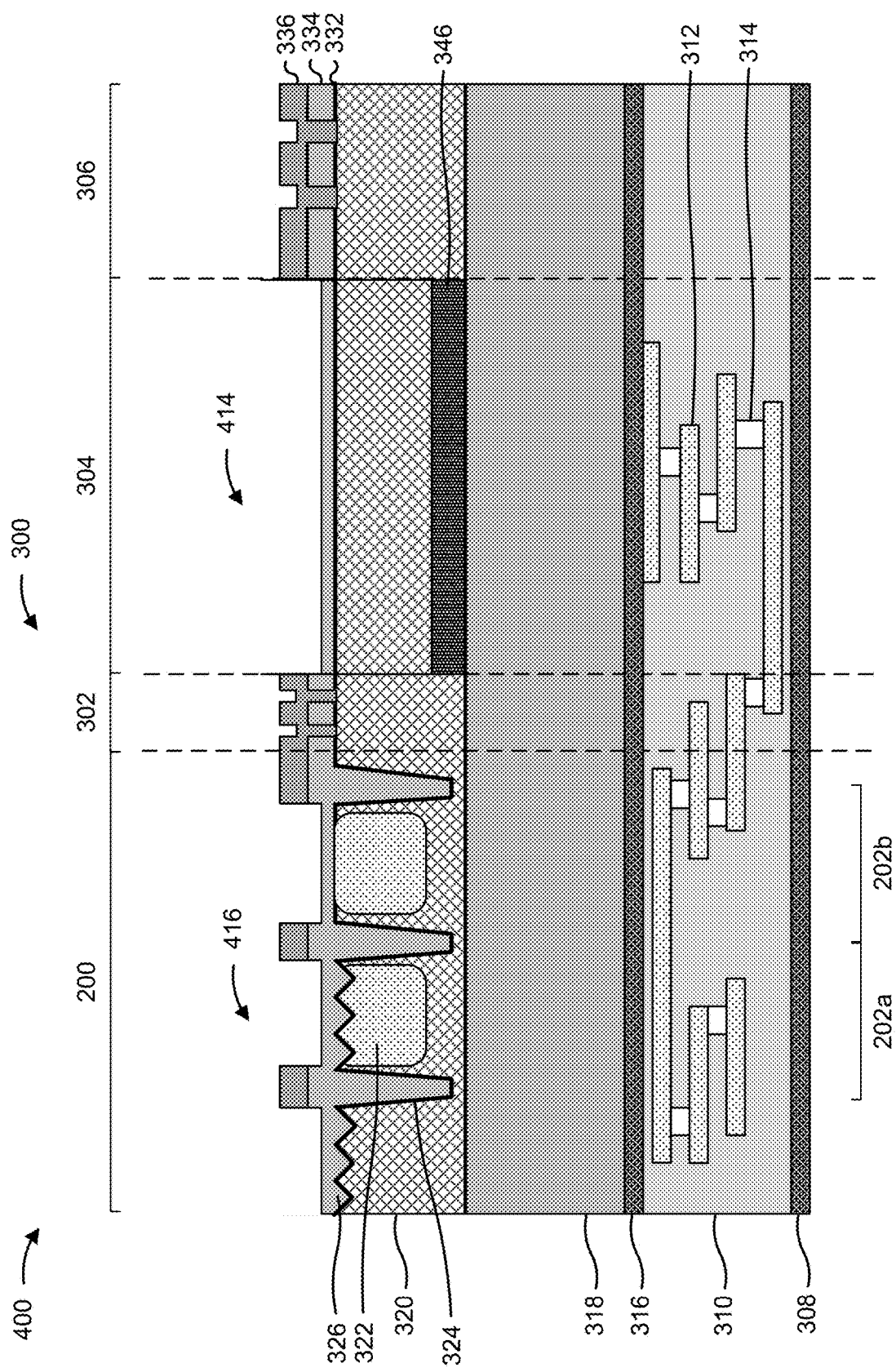
Figure 4P:
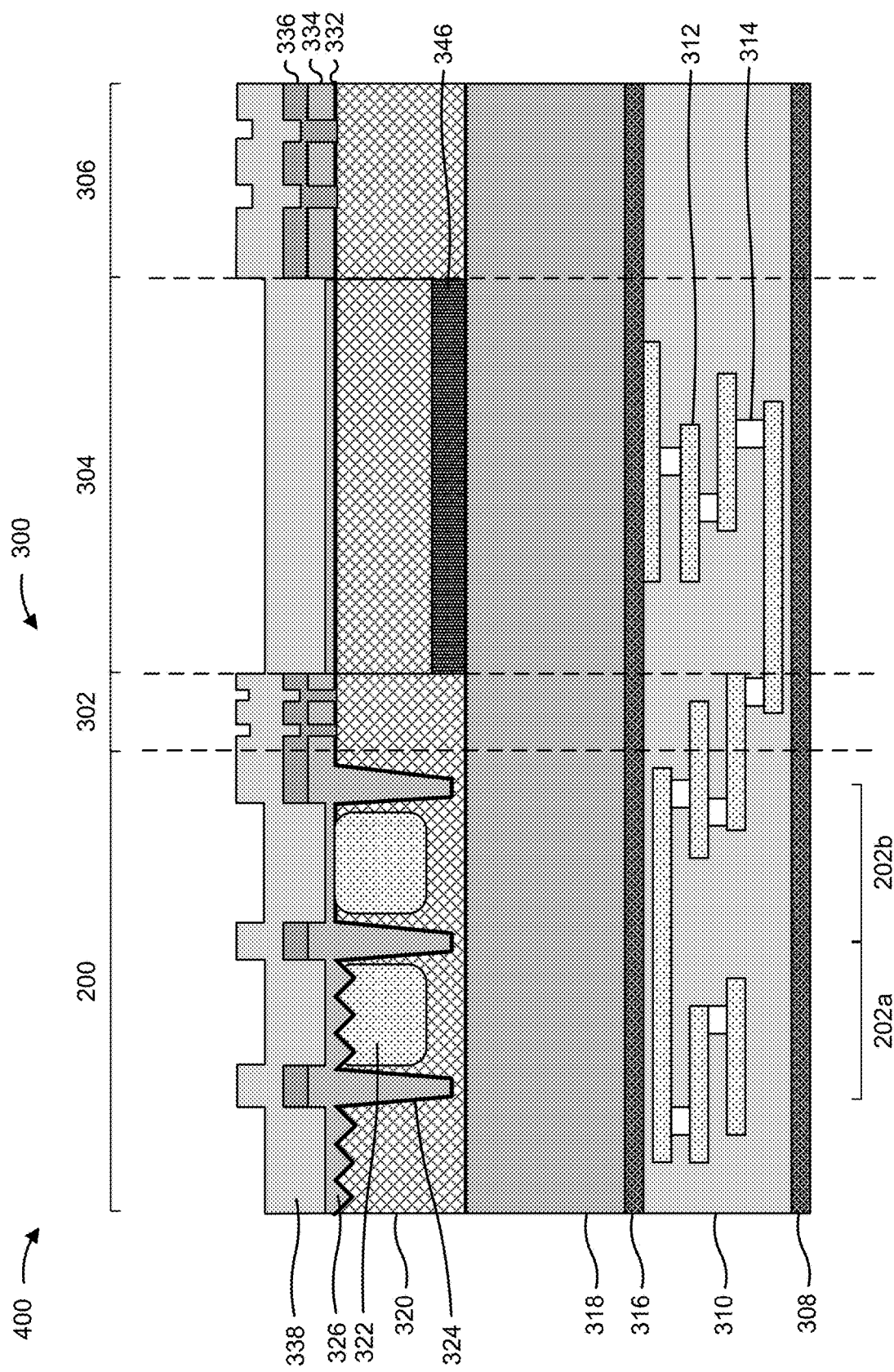
Figure 4Q:
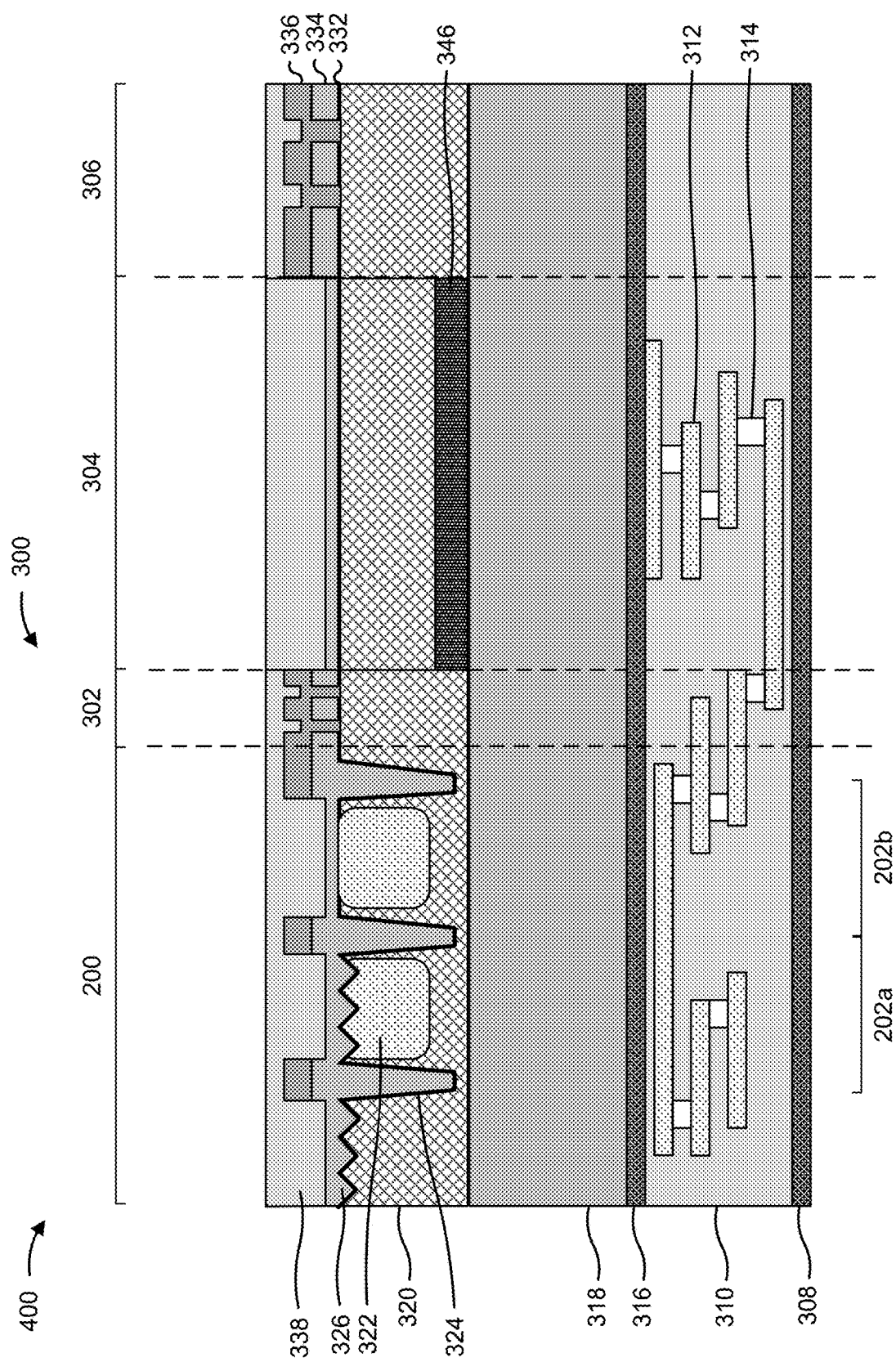
Figure 4R:
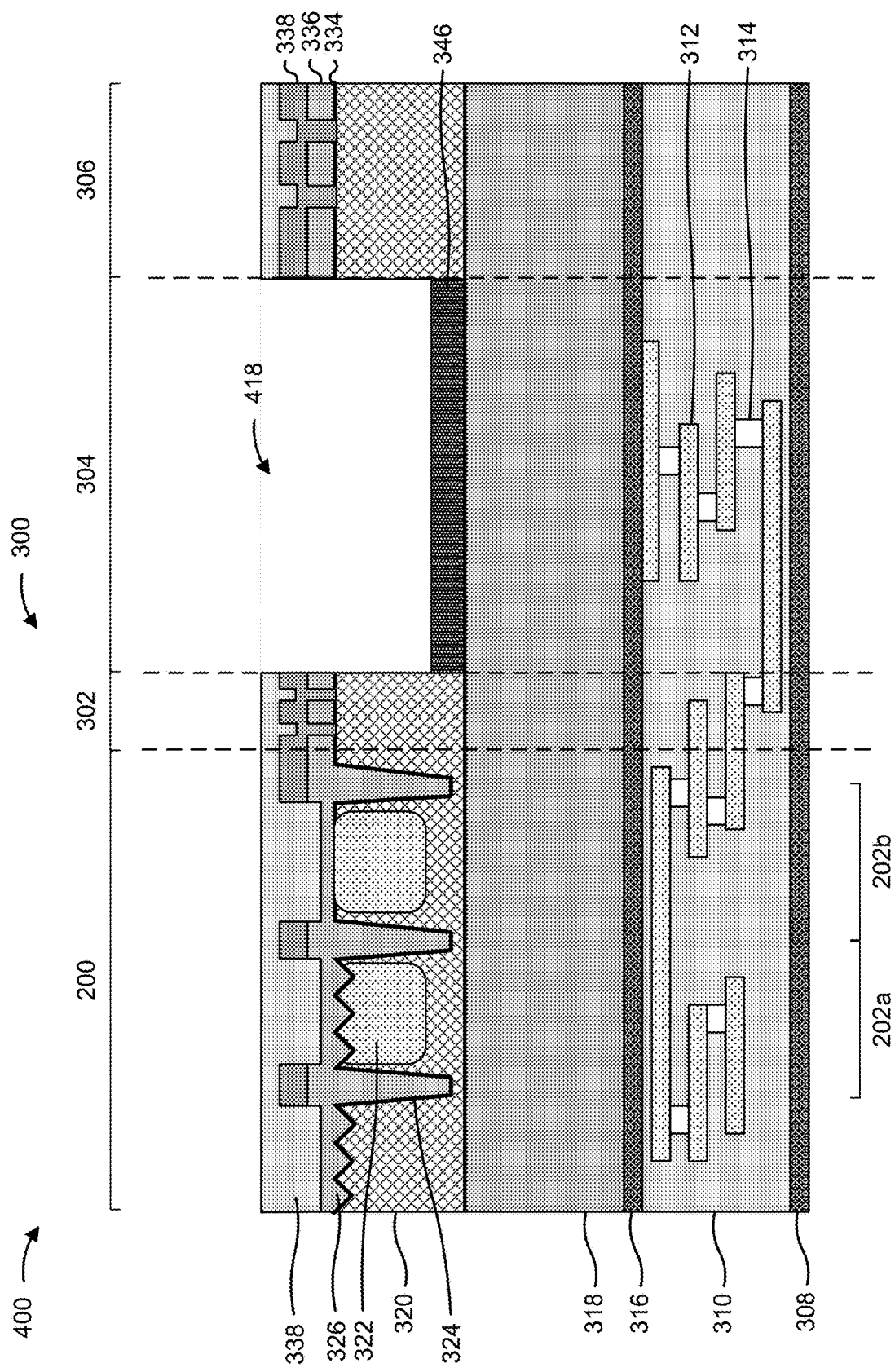
Figure 4S:
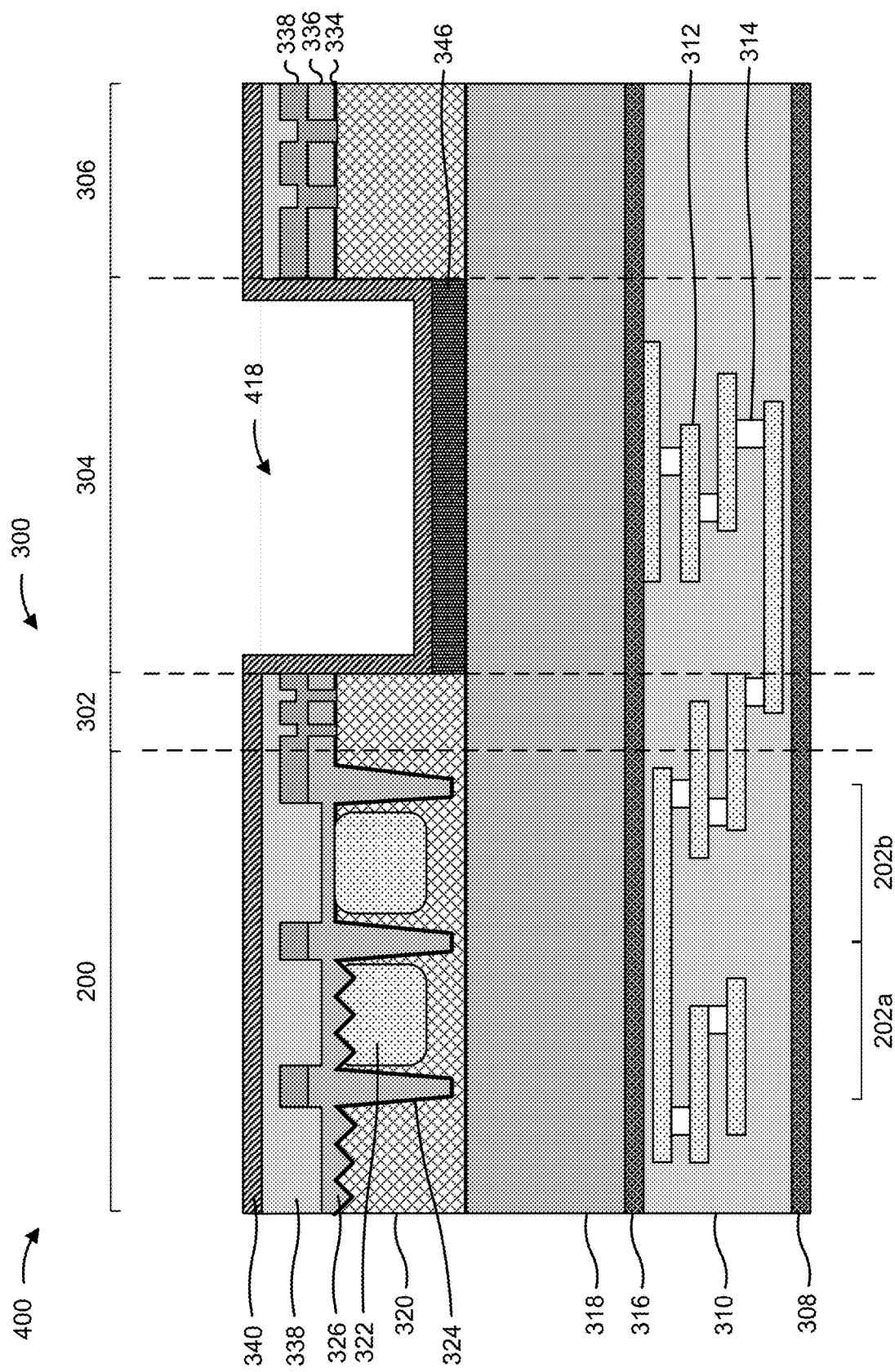
Figure 4T:
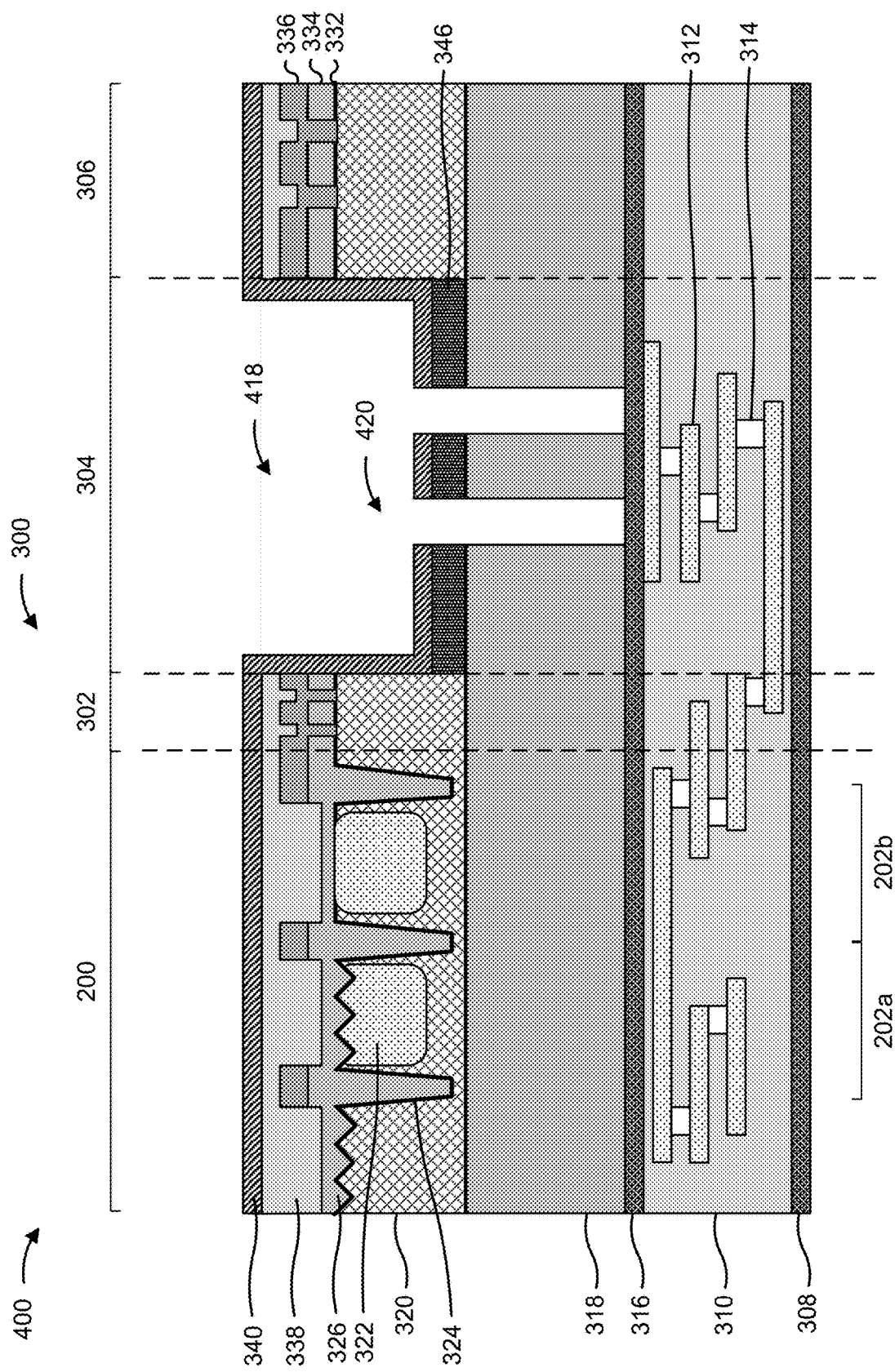
Figure 4U:
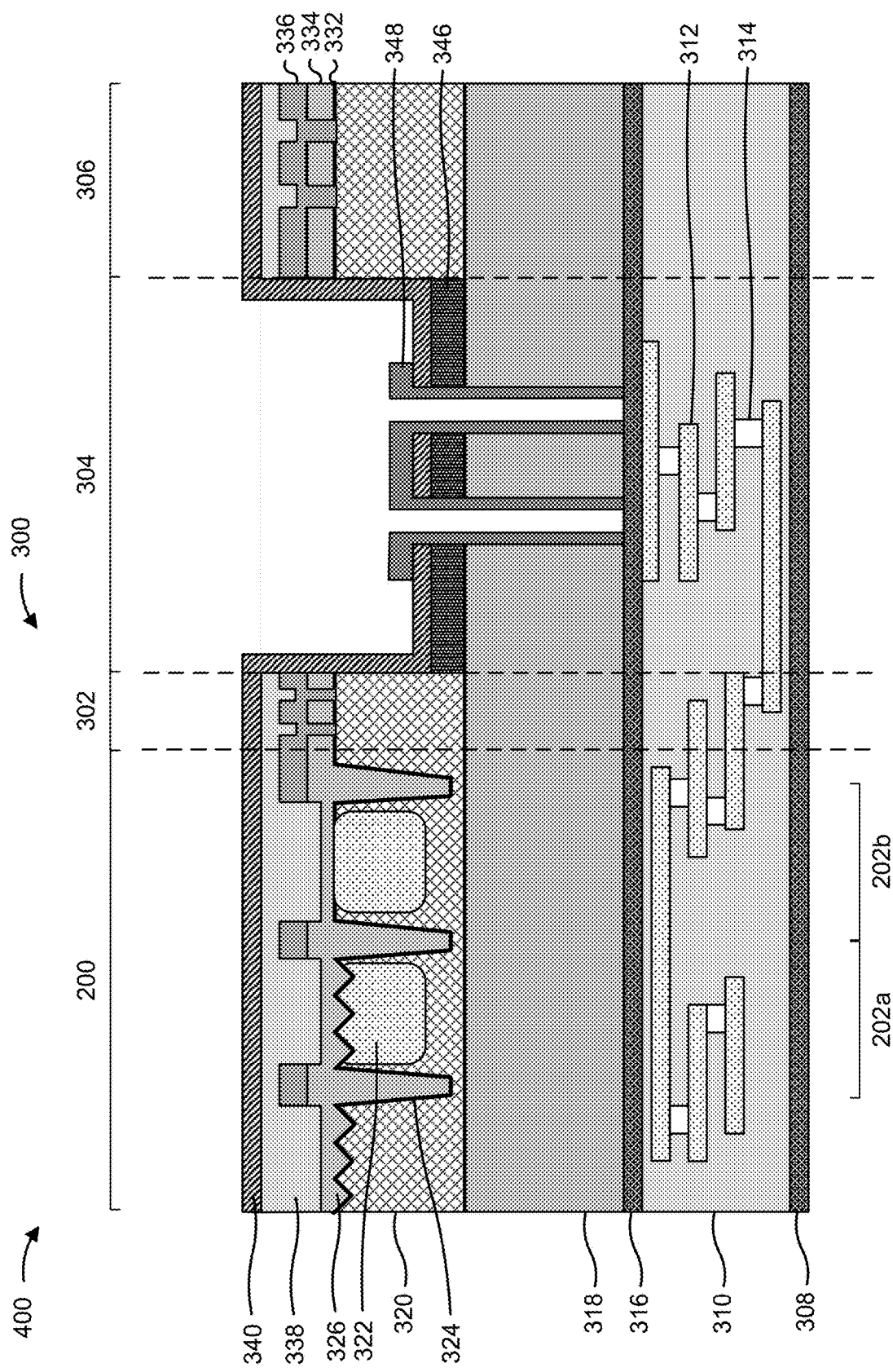
Figure 4V:
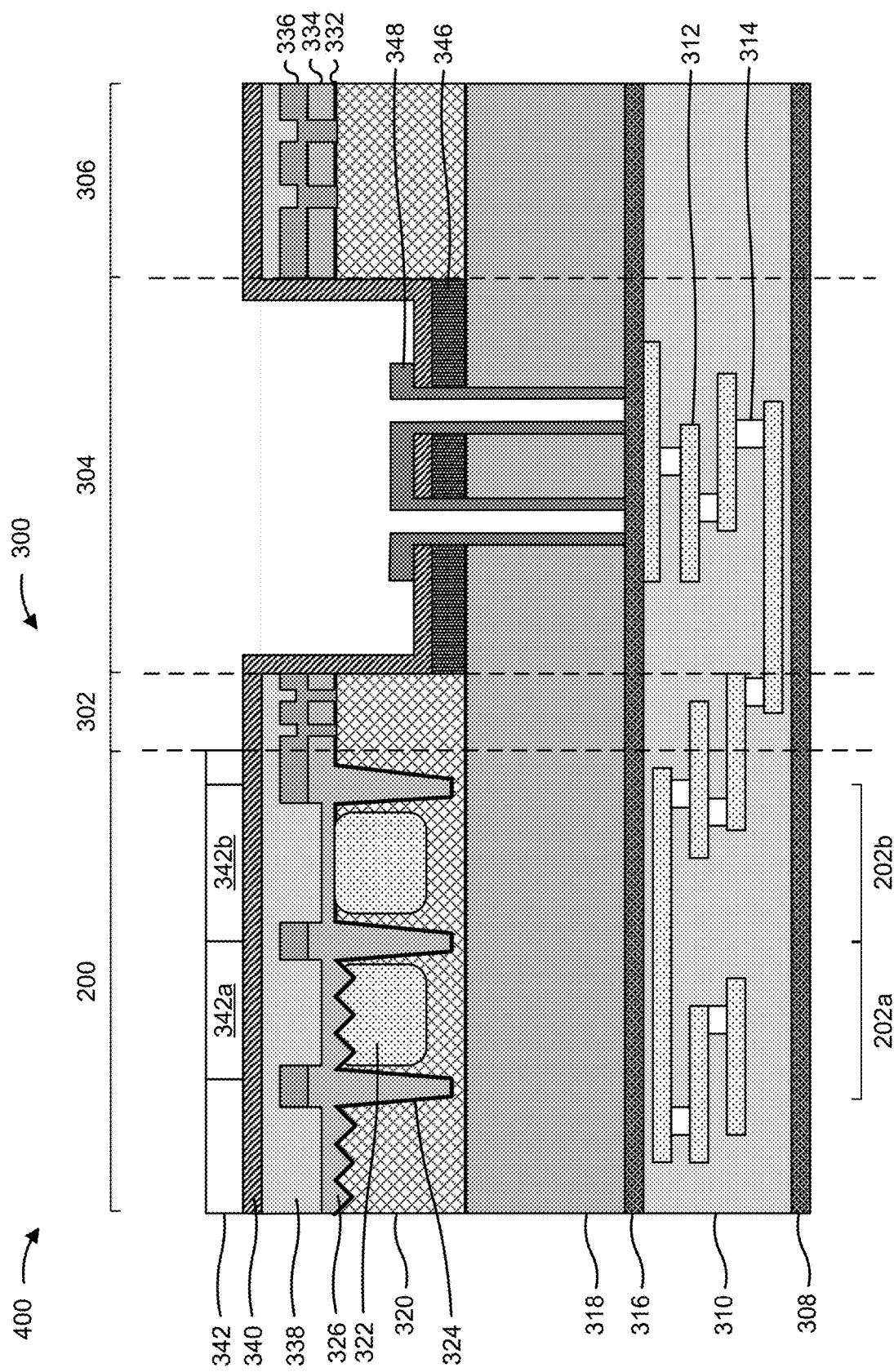
Figure 4W:
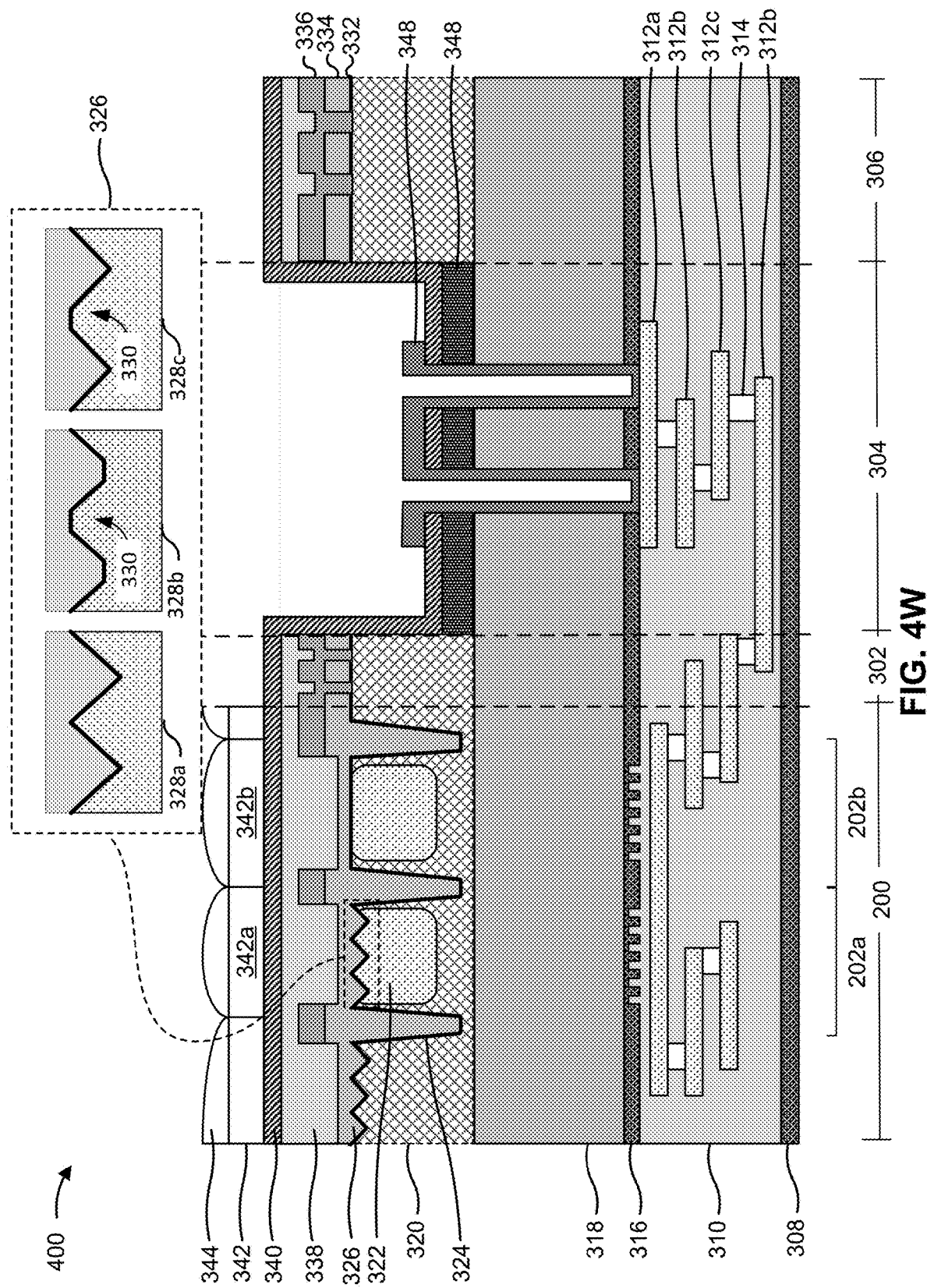

FIGS. 4A-4W are diagrams of an example implementation 400 described herein. Example implementation 400 may be an example process for forming the optoelectronic device 300 including the field of HA structures 328 within the HA region 326.

As shown in FIG. 4A, the optoelectronic device 300 may include the pixel array 200, the metal shield region 302, the bonding pad region 304, and the scribe line region 306. Moreover, the optoelectronic device 300 may include the substrate layer 320, the STI structure 346 formed in the substrate layer 320, the ILD layer 318 formed on the substrate layer 320, and the USG layer 316 formed on the ILD layer 318.

As shown in FIG. 4B, one or more semiconductor processing tools may form the IMD layer 310 below and/or over the ILD layer 318, and over and/or on the USG layer 316. For example, the deposition tool 102 may deposit the IMD layer 310 using a CVD technique, a PVD technique, an ALD technique, or another type of deposition technique.

As further shown in FIG. 4B, one or more semiconductor processing tools may form the metallization layers 312 and the contacts 314 in the IMD layer 310. In some implementations, each metallization layer 312 and each contact 314 may be formed using a deposition operation or a plating operation. For example, the plating tool 112 may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material in and/or on the IMD layer 310 to form the metallization layers 312 and the contacts 314.

In some implementations, forming the metallization layers 312 and the contacts 314 may include a plurality of plating operations. For example, a first portion of the IMD layer 310 may be formed, and the metallization layer 312a may be formed in the first portion of the IMD layer 310. A second portion of the IMD layer 310 may be formed, and the metallization layer 312b (and the contacts 314 connecting the metallization layer 312a and the metallization layer 312b) may be formed in the second portion of the IMD layer 310. A third portion of the IMD layer 310 may be formed, and the metallization layer 312c (and the contacts 314 connecting the metallization layer 312b and the metallization layer 312c) may be formed in the third portion of the IMD layer 310. A fourth portion of the IMD layer 310 may be formed over the metallization layer 312c to electrically insulate the metallization layer 312c.

As shown in FIG. 4C, one or more semiconductor processing tools may form the buffer layer 308 over and/or on the IMD layer 310. For example, the deposition tool 102 may deposit the buffer layer 308 on the IMD layer 310. In some implementations, the deposition tool 102 may deposit the buffer layer 308 using a CVD technique, a PVD technique, an ALD technique, or another type of deposition technique. The optoelectronic device 300 may be bonded or attached to a carrier substrate using the buffer layer 308 so that back side processing may be performed on the optoelectronic device 300 to form one or more layers and/or structures on the back side of the optoelectronic device 300 (e.g., on the side of the substrate layer 320 opposing the side of the substrate layer 320 on which the ILD layer 318 is formed).

As shown in FIG. 4D, one or more semiconductor processing tools may form a plurality of photodiodes 322 in the substrate layer 320. For example, the implantation tool 114 may dope the portions of the substrate layer 320 using an ion implantation technique to form a respective photodiode 322 for each of the pixel sensors 202, such as the pixel sensor 202a and the pixel sensor 202b. The substrate layer 320 may be doped with a plurality of types of ions to form a p-n junction for each photodiode 322. For example, the substrate layer 320 may be doped with an n-type dopant to form a first portion (e.g., an n-type portion) of a photodiode 322 and a p-type dopant to form a second portion (e.g., a p-type portion) of the photodiode 322. In some implementations, another technique is used to form the photodiodes 322 such as diffusion.

As shown in FIG. 4E, a plurality of DTI structures 324 may be formed in the substrate layer 320. In particular, a DTI structure 324 may be formed between each of the photodiodes 322 of the pixel sensors 202. As an example, a DTI structure 324 may be formed between the photodiodes 322 of the pixel sensor 202a and the pixel sensor 202b, a DTI structure 324 may be formed between the photodiodes 322 of the pixel sensor 202a and another adjacent pixel sensor 202, a DTI structure 324 may be formed between the photodiodes 322 of the pixel sensor 202b and another adjacent pixel sensor 202, and so on.

In some implementations, one or more semiconductor processing tools (e.g., of the plurality of semiconductor tools 102-114) may be used to form the DTI structures 324 in the substrate layer 320. For example, the deposition tool 102 may form a photoresist layer on the substrate layer 320, the exposure tool 104 may expose the photoresist layer to a radiation source to pattern the photoresist layer, the developer tool 106 may develop and remove portions of the photoresist layer to expose the pattern, and the etch tool 108 may etch the portions of substrate layer 320 to form the DTI structures 324 in the substrate layer 320. In some implementations, a photoresist removal tool removes the remaining portions of the photoresist layer (e.g., using a chemical stripper and/or another technique) after the etch tool 108 etches the substrate layer 320.

As further shown in FIG. 4E, and as described in greater detail in connection with FIGS. 4F-4J, cavities 402 for a field of HA structures may be formed in one or more regions 404 (e.g., cavities for the field of HA structures 328). The regions 404 may correspond to surface regions of the substrate layer 320 and/or surface regions of the or more of the photodiodes 322. In some implementations, the cavities 402 may correspond to inverted pyramid-shaped cavity regions or inverted conical-shaped cavity regions, among other examples.

As part of forming the cavities 402, and as shown in FIG. 4F, a deposition tool (e.g., the deposition tool 102 of FIG. 1 that includes a spin coating tool) may deposit a layer of a photoresist material 406 on and/or over the photodiode 322 (and/or on and/or over the substrate layer 320). In some implementations, the layer of the photoresist material 406 includes a negative photoresist material (e.g., a photoresist in which a portion that is exposed to light becomes insoluble to a photoresist developer solution). In some implementations, a thickness D3 of the layer of the photoresist material 406 may be included in a range of approximately 180 nanometers to approximately 220 nanometers. If the thickness D3 is less than approximately 180 nanometers, the layer of the photoresist material 406 may be insufficient as a mask for a subsequent etching operation. If the thickness is greater than approximately 220 nanometers, the layer of the photoresist material 406 may be incompatible with an exposure recipe (e.g., a duration of an exposure to radiation from an exposure tool such as the exposure tool 104 of FIG. 1). However, other values and ranges for the thickness D3 are within the scope of the present disclosure.

As shown in FIG. 4G, an opening 408 is formed in the layer of the photoresist material 406. The opening 408 may expose the plateau region 330. Forming the opening 408 may include an exposure tool (e.g., the exposure tool 104 of FIG. 1) projecting radiation (e.g., light) through a mask to expose a portion of the layer of the photoresist material 406. In the case where the layer of the photoresist material 406 includes the negative photoresist material, a developer tool (e.g., the developer tool 106 of FIG. 1) may remove (e.g., dissolve) the exposed portion of the layer of the photoresist material 406 to form the opening 408.

As shown in FIG. 4H, the carbon layer 354 is formed within the plateau region 330. As an example, and as part of forming the carbon layer 354, an etch tool (e.g., the etch tool 108 of FIG. 1, and/or or another suitable tool) may perform a dry etch operation (e.g., a plasma etch operation) using a carbon-fluoride based etchant to remove an oxide from a surface of the photodiode 322 (and/or a surface of substrate layer 320). In such a case, a byproduct of the etchant (e.g., carbon free radicals) may form the carbon layer 354 on the surface of the photodiode 322 within the plateau region 330.

As shown in FIG. 4I, the layer of the photoresist material 406 is removed. As an example, and as part of removing the layer of the photoresist material, an etch tool (e.g., the etch tool 108 of FIG. 1, and/or or another suitable tool) may perform a wet strip operation using a chromium based solvent.

As shown in FIG. 4J, a cavity 402a and a cavity 402b are formed within the region 404. The cavity 402a and the cavity 402b may be symmetrically formed about a central axis (e.g., the central axis 352) of the plateau region 330. As an example, and as part of forming the cavity 402a and the cavity 402b, an etch tool (e.g., the etch tool of FIG. 1, and/or another suitable tool) may perform a wet etch operation using a tetramethyl ammonium hydroxide (TMAH) based etchant. Additionally, or alternatively, the etch tool may perform the wet etch operation using a choline hydroxide based etchant.

In some cases, the carbon layer 354 may block an etchant from removing the plateau region 330. Additionally, or alternatively and for the etchant, an etch rate of the carbon layer 354 may be lesser relative to an etch rate of the photodiode 322 (and/or the substrate layer 320).

As shown in FIG. 4J, the cavity 402a and/or the cavity 402b include a profile having an inverted triangle-shape. Additionally, or alternatively, the cavity 402a and/or the cavity 402b may include a profile having an inverted trapezoid shape.

In some cases, a shape of a profile may be dependent on a duration of the wet etch operation. Further, and in some cases, a duration of the wet etch operation may be sufficient to remove the plateau region 330 (and/or the carbon layer 354).

Formation of the cavity 402a and the cavity 402b, using techniques described in connection with FIGS. 4F-4J, may use a single dry etch operation, a single wet strip operation, and/or a single wet etch operation. Relative to other techniques using a positive photoresist material and multiple hard mask layers to form the cavity 402a and/or 408b, the techniques of FIGS. 4F-4J include a reduced number of operations. In this way, an amount of resources to fabricate the cavity 402a and/or the cavity 402b (e.g., an amount of semiconductor manufacturing tools, raw materials, manpower, and/or computing resources, among other examples) may be decreased.

As shown in FIG. 4K, the ARC layer 332 may be formed above and/or on the substrate layer 320, may be formed in the DTI structures 324, and may be formed in the cavities 402. In particular, a semiconductor processing tool (e.g., the deposition tool 102) may deposit the ARC layer 332 using a CVD technique, a PVD technique, an ALD technique, or another type of deposition technique. The ARC layer 332 may include a suitable material for reducing a reflection of incident light projected toward the photodiodes 322. In some implementations, the semiconductor processing tool may form the ARC layer 332 to a thickness in a range from approximately 200 angstroms to approximately 1000 angstroms.

As shown in FIG. 4L, one or more DTI structures 324 may be filled with an oxide material. Additionally, or alternatively, one or more cavities 402 may be filled with an oxide material to form the field of HA structures 328. In particular, a semiconductor processing tool (e.g., the deposition tool 102) may deposit the oxide material such that the oxide layer 334 is formed in the DTI structures 324, in the cavities 402, and over the substrate layer 320. The semiconductor processing tool may deposit the oxide material using various CVD techniques and/or ALD techniques, such as PECVD, HDP-CVD, SACVD, or PEALD.

As shown in FIG. 4M, a plurality of openings 410 (or trenches) may be formed through the oxide layer 334 and the ARC layer 332 in the metal shield region 302, and a plurality of openings 412 (or trenches) may be formed through the oxide layer 334 and the ARC layer 332 to the substrate layer 320 in the scribe line region 306. The openings 410 and 412 may be formed by coating the oxide layer 334 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 410 and 412 into the oxide layer 334 and the ARC layer 332 to the substrate layer 320 (e.g., using the etch tool 108) based on the pattern in the photoresist.

As shown in FIG. 4N, the metal shielding layer 336 may be formed over and/or on the oxide layer 334 and in the openings 410 and 412. The metal shielding layer 336 may provide shielding for the components and/or devices formed in the metal shield region 302 and in the scribe line region 306. The metal shielding layer 336 may be formed of a metal material, such as gold, silver, aluminum, a metal alloy, or a similar metal. In some implementations, a semiconductor processing tool (e.g., the plating tool 112) may form the metal shielding layer 336 using a plating technique such as electroplating (or electro-chemical deposition). In these examples, the semiconductor processing tool may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the optoelectronic device 300. The plating solution reaches the optoelectronic device 300 and deposits plating material ions onto the oxide layer 334 and in the openings 410 and 412 to form the metal shielding layer 336.

As shown in FIG. 4O, an opening 414 (or a trench) may be formed through the metal shielding layer 336 and in a portion of the oxide layer 334 in the bonding pad region 304, and a plurality of openings 416 (or trenches) may be formed through the metal shielding layer 336 and in a portion of the oxide layer 334 in the pixel array 200. The openings 414 and 416 may be formed by coating the metal shielding layer 336 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 408 and 410 into the metal shielding layer and in a portion of the oxide layer 334 (e.g., using the etch tool 108) based on the pattern in the photoresist.

As shown in FIG. 4P, the BSI oxide layer 338 may be formed in the openings 414 and 416, and over the metal shielding layer 336 and the oxide layer 334. In particular, a semiconductor processing tool (e.g., the deposition tool 102) may deposit an oxide material (e.g., a silicon oxide ($SiO_x$) or another type of oxide) such that the BSI oxide layer 338 is formed using various CVD techniques and/or ALD techniques, such as PECVD, HDP-CVD, SACVD, or PEALD.

As shown in FIG. 4Q, the BSI oxide layer 338 may be planarized. In particular, a semiconductor processing tool (e.g., the planarization tool 110) may perform a planarization or polishing process such as CMP. A CMP process may include depositing a slurry (or polishing compound) onto a polishing pad. The carrier substrate including the optoelectronic device 300 may be mounted to a carrier, which may rotate the carrier substrate as the carrier substrate is pressed against the polishing pad. The slurry and polishing pad act as an abrasive that polishes or planarizes the BSI oxide layer 338 as the carrier substrate is rotated. The polishing pad may also be rotated to ensure a continuous supply of slurry is applied to the polishing pad.

As shown in FIG. 4R, an opening 418 (or trench) may be formed in the bonding pad region 304. In particular the opening 418 may be formed through the BSI oxide layer 338, through the metal shielding layer 336, through the oxide layer 334, through the ARC layer 332, and through the substrate layer 320 to the STI structure 346. The opening 418 may be formed by coating the BSI oxide layer 338 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the opening 418 (e.g., using the etch tool 108) based on the pattern in the photoresist.

As shown in FIG. 4S, the buffer oxide layer 340 may be formed over the BSI oxide layer 338 and over the STI structure 346 in the opening 418. In particular, a semiconductor processing tool (e.g., the deposition tool 102) may deposit an oxide material (e.g., a silicon oxide ($SiO_x$) or another type of oxide) such that the buffer oxide layer 340 is formed using various CVD techniques and/or ALD techniques, such as PECVD, HDP-CVD, SACVD, or PEALD.

As shown in FIG. 4T, openings 420 (or vias) may be formed in the opening 418 of the bonding pad region 304. In particular, the openings 420 may be formed through the buffer oxide layer 340, through the STI structure 346, through the ILD layer 318, and to a metallization layer 312 (e.g., the metallization layer 312a) in the IMD layer 310. The openings 420 may be formed by coating the buffer oxide layer 340 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the openings 420 (e.g., using the etch tool 108) based on the pattern in the photoresist.

As shown in FIG. 4U, the bonding pad 348 may be formed in the openings 420. For example, a semiconductor processing tool (e.g., the deposition tool 102 or the plating tool 112) may form a metal layer (e.g., an aluminum layer, a gold layer, a silver layer, a metal alloy layer, or another type of metal layer) on the buffer oxide layer 340, on the STI structure 346, and in the openings 420. Portions of the metal layer may be removed by coating the metal layer with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the portions (e.g., using the etch tool 108) based on the pattern in the photoresist to form the bonding pad 348.

As shown in FIG. 4V, the filter layer 342 is formed for the pixel sensors in the pixel array 200. The filter layer 342 may be formed over and/or on the buffer oxide layer 340. In some implementations, a semiconductor processing tool (e.g., the deposition tool 102) may deposit the filter layer 342 using a CVD technique, a PVD technique, an ALD technique, or another type of deposition technique.

As shown in FIG. 4W, a micro-lens layer 344 including a plurality of micro-lenses is formed over and/or on the filter layer 342. The micro-lens layer 344 may include a respective micro-lens for each of the pixel sensors 202 included in the pixel array 200. In some implementations, the micro-lens layer 344 may be over the HA regions 326 including the HA structures 328.

As indicated above, FIGS. 4A-4W are provided as an example. Other examples may differ from what is described with regard to FIGS. 4A-4W.

Figure 5A:
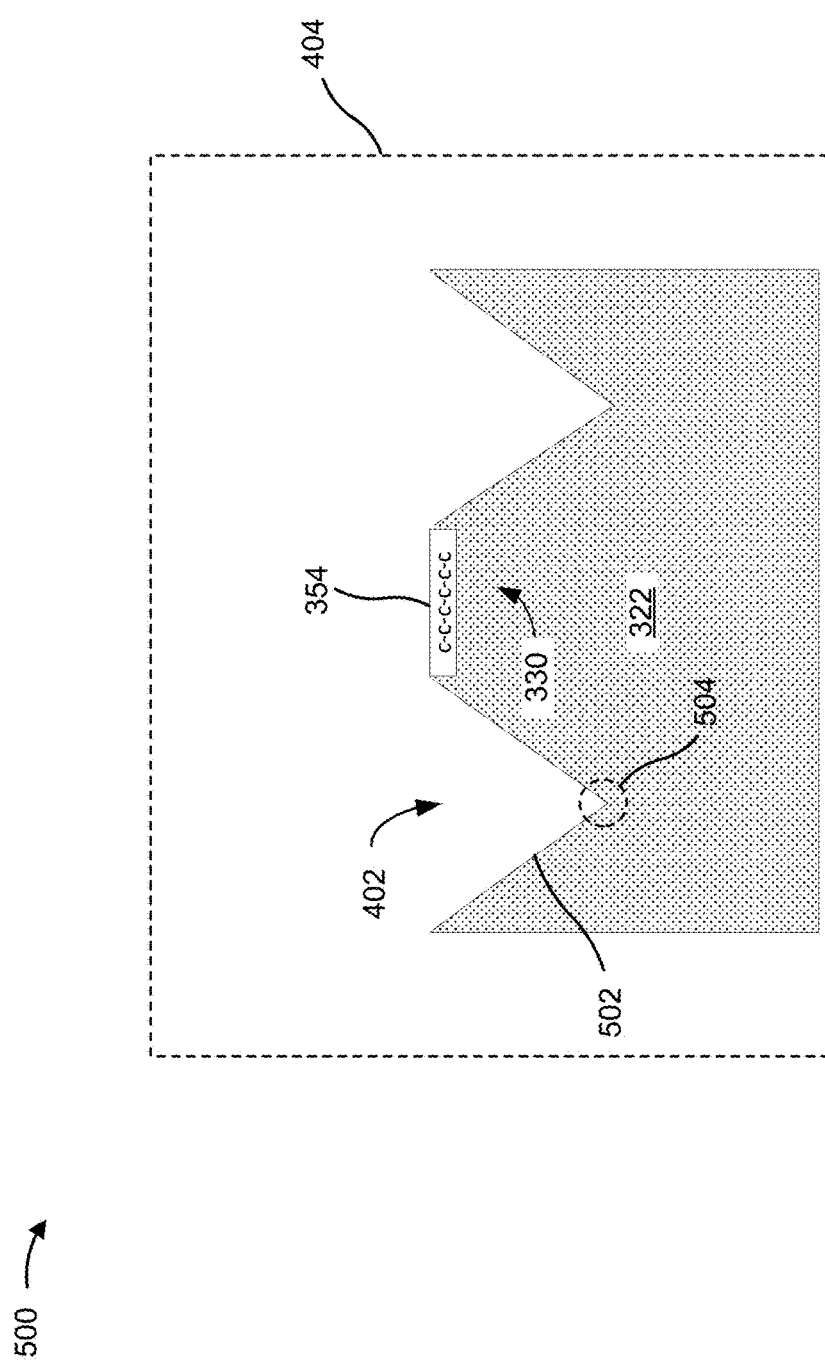
FIGS. 5A and 5B are diagrams of example implementations of a cavity used to form the high absorption structure described herein.
Figure 5B:
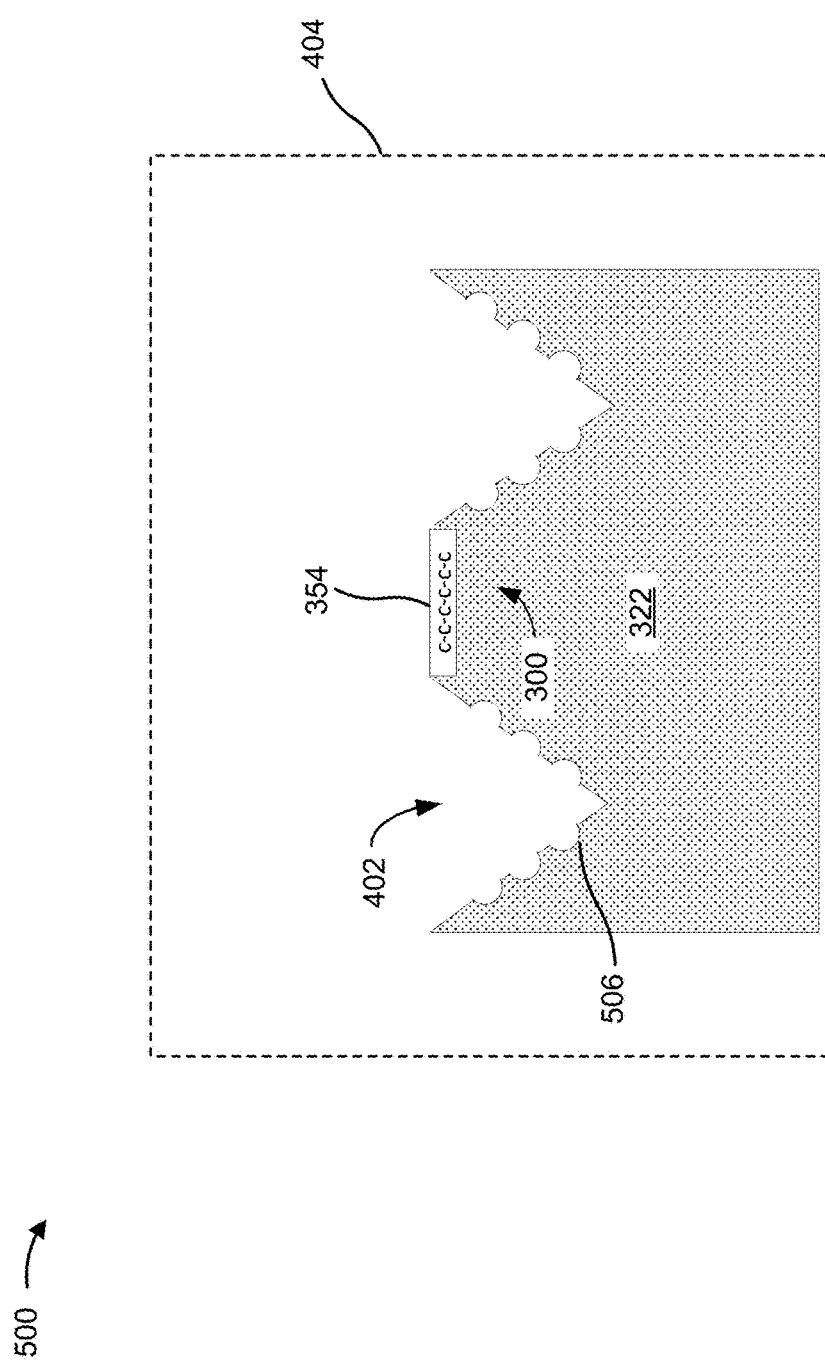

FIGS. 5A and 5B are diagrams of example implementations 500 of the cavity 402 used to form an HA structure described herein. In some implementations, and as shown in FIG. 5A, the cavity 402 includes a smooth surface 502 that angles into the photodiode 322 (and/or the substrate layer 320). Further, the cavity 402 may include an apex 504. In some implementations, and as shown, the apex 504 includes a pointed transition. In some implementations, the apex 504 includes a rounded transition. Further, and in some implementations, the apex 504 includes a planar surface.

In some implementations, the smooth surface 502 includes a <111> lattice orientation (e.g., a Miller index). In some implementations, the apex includes a <110> lattice orientation.

As shown in FIG. 5B, the cavity 402 may include pitting 506 in surfaces of the cavity. The pitting 506 may include dimples and/or indentations corresponding to scallop-shaped regions.

Forming the pitting 506 may include, for example, an etch tool (e.g., the etch tool 108 of FIG. 1, or another suitable too) performing a dry etch operation. Additionally, or alternatively, forming the pitting 506 may include a laser tool performing a laser operation.

In some implementations, the pitting 506 increases a surface area within the cavity 402 to increase an amount of photons and/or incident light absorbed by the photodiode 322. In this way, an HA structure (e.g., the HA structure 350) including the pitting 506 may have a QE that is greater relative to another QE of another HA structure not including the pitting 506. In such a case, an amount of resources (e.g., an amount of semiconductor manufacturing tools, raw materials, manpower, and/or computing resources, among other examples) to fabricate a volume an optoelectronic device (e.g., the optoelectronic device 300) that satisfies a performance threshold may be decreased.

FIG. 6 is a diagram of an implementation 600 of example photomask patterns described herein. The example photomask patterns include photomask pattern 602 and photomask pattern 604. In some implementations, the photomask pattern 602 and/or the photomask pattern 604 may be used in patterning a field of openings in a layer of a negative photoresist material (e.g., the layer of photoresist material 406) as part of forming a field of HA structures (e.g., the field of HA structures 328).

Photomask pattern 602 may correspond to an "opposite tone" photomask pattern for use with a layer of a negative photoresist material (e.g., the layer of the photoresist material 406). The photomask pattern 602 includes a matrix pattern of opaque film features 606 that may be distributed on a transparent substrate 608. In some implementations, the opaque film features 606 are formed from a chromium film material and the transparent substrate 608 is formed from a borosilicate material, among other examples. Each of the opaque film features 606 may block exposure of the layer of the negative photoresist material to radiation (e.g., light) from an exposure tool (e.g., the exposure tool 104). In some implementations, each of the opaque film features 606 may correspond to an opening used to form a carbon layer on a photodiode and/or a substrate (e.g., the opening 408).

Photomask pattern 604 may correspond to an "opposite tone" photomask pattern for use with a layer of a negative photoresist material (e.g., the layer of the photoresist material 406). The photomask pattern 602 includes a radial pattern of the opaque film features 606 that may be distributed on the transparent substrate 608.

As indicated above, FIG. 6 is provided as an example. Other examples may differ from what is described with regard to FIG. 6. Additionally, and although FIG. 6 shows the opaque film features 606 including round shapes, the opaque film features 606 may include other shapes such as rectangular shapes, triangular shapes, and/or elliptical shapes, among other examples.

Figure 7:
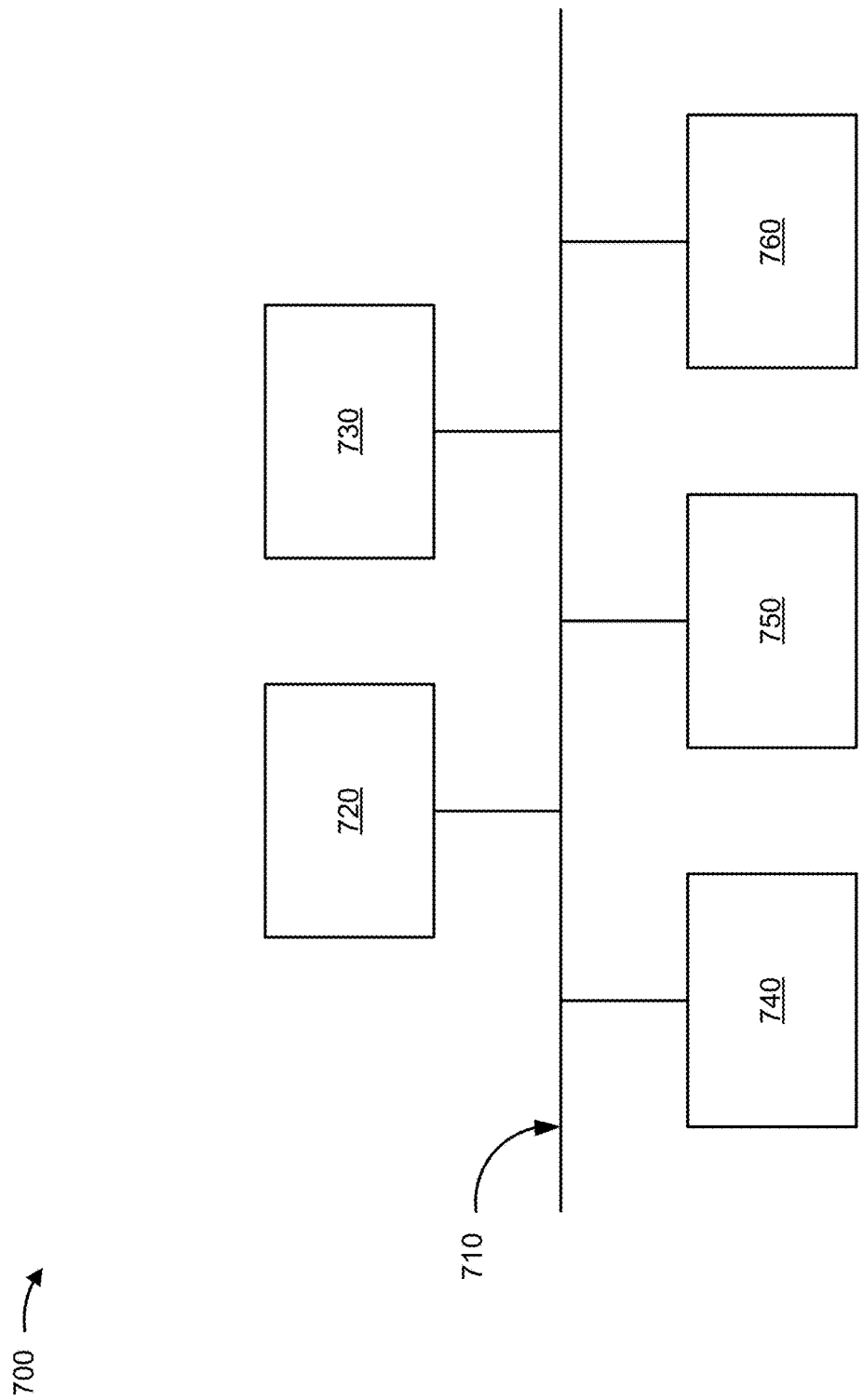
FIG. 7 is a diagram of example components of one or more devices of FIG. 1.

FIG. 7 is a diagram of example components of a device 700. In some implementations, one or more of the semiconductor processing tools 102-114 and/or the wafer/die transport tool 116 may include one or more devices 700 and/or one or more components of the device 700. As shown in FIG. 7, the device 700 may include a bus 710, a processor 720, a memory 730, an input component 740, an output component 750, and/or a communication component 760.

The bus 710 may include one or more components that enable wired and/or wireless communication among the components of the device 700. The bus 710 may couple together two or more components of FIG. 7, such as via operative coupling, communicative coupling, electronic coupling, and/or electric coupling. For example, the bus 710 may include an electrical connection (e.g., a wire, a trace, and/or a lead) and/or a wireless bus. The processor 720 may include a central processing unit, a graphics processing unit, a microprocessor, a controller, a microcontroller, a digital signal processor, a field-programmable gate array, an application-specific integrated circuit, and/or another type of processing component. The processor 720 may be implemented in hardware, firmware, or a combination of hardware and software. In some implementations, the processor 720 may include one or more processors capable of being programmed to perform one or more operations or processes described elsewhere herein.

The memory 730 may include volatile and/or nonvolatile memory. For example, the memory 730 may include random access memory (RAM), read only memory (ROM), a hard disk drive, and/or another type of memory (e.g., a flash memory, a magnetic memory, and/or an optical memory). The memory 730 may include internal memory (e.g., RAM, ROM, or a hard disk drive) and/or removable memory (e.g., removable via a universal serial bus connection). The memory 730 may be a non-transitory computer-readable medium. The memory 730 may store information, one or more instructions, and/or software (e.g., one or more software applications) related to the operation of the device 700. In some implementations, the memory 730 may include one or more memories that are coupled (e.g., communicatively coupled) to one or more processors (e.g., processor 720), such as via the bus 710. Communicative coupling between a processor 720 and a memory 730 may enable the processor 720 to read and/or process information stored in the memory 730 and/or to store information in the memory 730.

The input component 740 may enable the device 700 to receive input, such as user input and/or sensed input. For example, the input component 740 may include a touch screen, a keyboard, a keypad, a mouse, a button, a microphone, a switch, a sensor, a global positioning system sensor, an accelerometer, a gyroscope, and/or an actuator. The output component 750 may enable the device 700 to provide output, such as via a display, a speaker, and/or a light-emitting diode. The communication component 760 may enable the device 700 to communicate with other devices via a wired connection and/or a wireless connection. For example, the communication component 760 may include a receiver, a transmitter, a transceiver, a modem, a network interface card, and/or an antenna.

The device 700 may perform one or more operations or processes described herein. For example, a non-transitory computer-readable medium (e.g., memory 730) may store a set of instructions (e.g., one or more instructions or code) for execution by the processor 720. The processor 720 may execute the set of instructions to perform one or more operations or processes described herein. In some implementations, execution of the set of instructions, by one or more processors 720, causes one or more processors 720 and/or the device 700 to perform one or more operations or processes described herein. In some implementations, hardwired circuitry may be used instead of or in combination with the instructions to perform one or more operations or processes described herein. Additionally, or alternatively, the processor 720 may be configured to perform one or more operations or processes described herein. Thus, implementations described herein are not limited to any specific combination of hardware circuitry and software.

The number and arrangement of components shown in FIG. 7 are provided as an example. The device 700 may include additional components, fewer components, different components, or differently arranged components than those shown in FIG. 7. Additionally, or alternatively, a set of components (e.g., one or more components) of the device 700 may perform one or more functions described as being performed by another set of components of the device 700.

Figure 8:
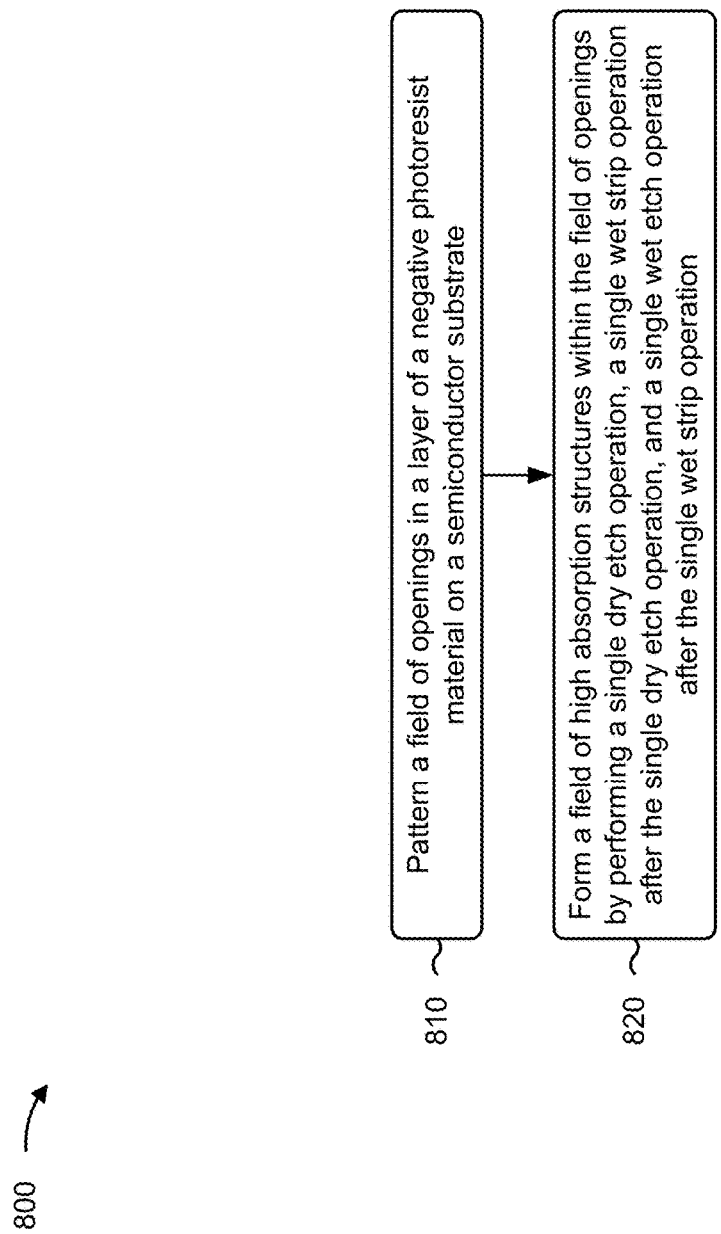
FIGS. 8 and 9 are flowcharts of example processes relating to forming the image sensor including the high absorption structure described herein.

FIG. 8 is a flowchart of an example process 800 relating to forming the image sensor including the high absorption structure. In some implementations, one or more process blocks of FIG. 8 are performed by one or more of semiconductor processing tools (e.g., one or more of the semiconductor processing tools 102-114). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include patterning a field of openings in a layer of a negative photoresist material on a semiconductor substrate (block 810). For example, one or more of the semiconductor processing tools 102-114 may pattern a field of openings (e.g., a field of one or more of the opening 408) in a layer of a negative photoresist material (e.g., the layer of the photoresist material 406) on a semiconductor substrate (e.g., the substrate layer 320 and/or the photodiode 322), as described above.

As further shown in FIG. 8, process 800 may include forming a field of HA structures within the field of openings by performing, a single dry etch operation, a single wet strip operation after the single dry etch operation, and a single wet etch operation after the single wet strip operation (block 820). For example, one or more of the semiconductor processing tools 102-114 may form a field of HA structures 328 within the field of openings by performing a single dry etch operation, a single wet strip operation after the single dry etch operation, and a single wet etch operation after the single wet strip operation, as described above. In some implementations, the single dry etch operation forms a carbon layer 354 on a surface of the semiconductor substrate. In some implementations, the single wet strip operation removes the layer of the negative photoresist material.

Process 800 may include additional implementations, such as any single implementation or any combination of implementations described below and/or in connection with one or more other processes described elsewhere herein.

In a first implementation, performing the single dry etch operation includes performing the single dry etch operation using a carbon-fluoride based etchant.

In a second implementation, alone or in combination with the first implementation, performing the single wet etch operation includes performing the single wet etch operation using a tetramethyl ammonium hydroxide based etchant.

In a third implementation, alone or in combination with one or more of the first and second implementations, performing the single wet operation includes performing the single wet etch operation to form a field of inverted pyramid-shaped cavities (e.g., a field of one or more of the cavity 402) that penetrate into the semiconductor substrate.

In a fourth implementation, alone or in combination with one or more of the first through third implementations, performing the single wet etch operation includes performing the single wet etch operation to form a field of plateau regions (e.g., one or more of the plateau region 330) and a field of cavity regions (e.g., a field of one or more of the cavity 402), where the field of cavity regions penetrates into the semiconductor substrate, and where the field of plateau regions is interspersed amongst the field of cavity regions.

In a fifth implementation, alone or in combination with one or more of the first through fourth implementations, performing the single wet etch operation forms a field of smooth surfaces (e.g., a field of one or more of the smooth surface 502) that angle into the semiconductor substrate, and further including forming pitting 506 in the field of smooth surfaces.

In a sixth implementation, alone or in combination with one or more of the first through fifth implementations, forming the pitting 506 in the field of smooth surfaces includes using a dry etch operation to form at least a portion of the pitting 506 in the field of smooth surfaces.

In a seventh implementation, alone or in combination with one or more of the first through sixth implementations, forming the pitting 506 in the field of smooth surfaces includes using a laser operation to form at least a portion of the pitting 506 in the field of smooth surfaces.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
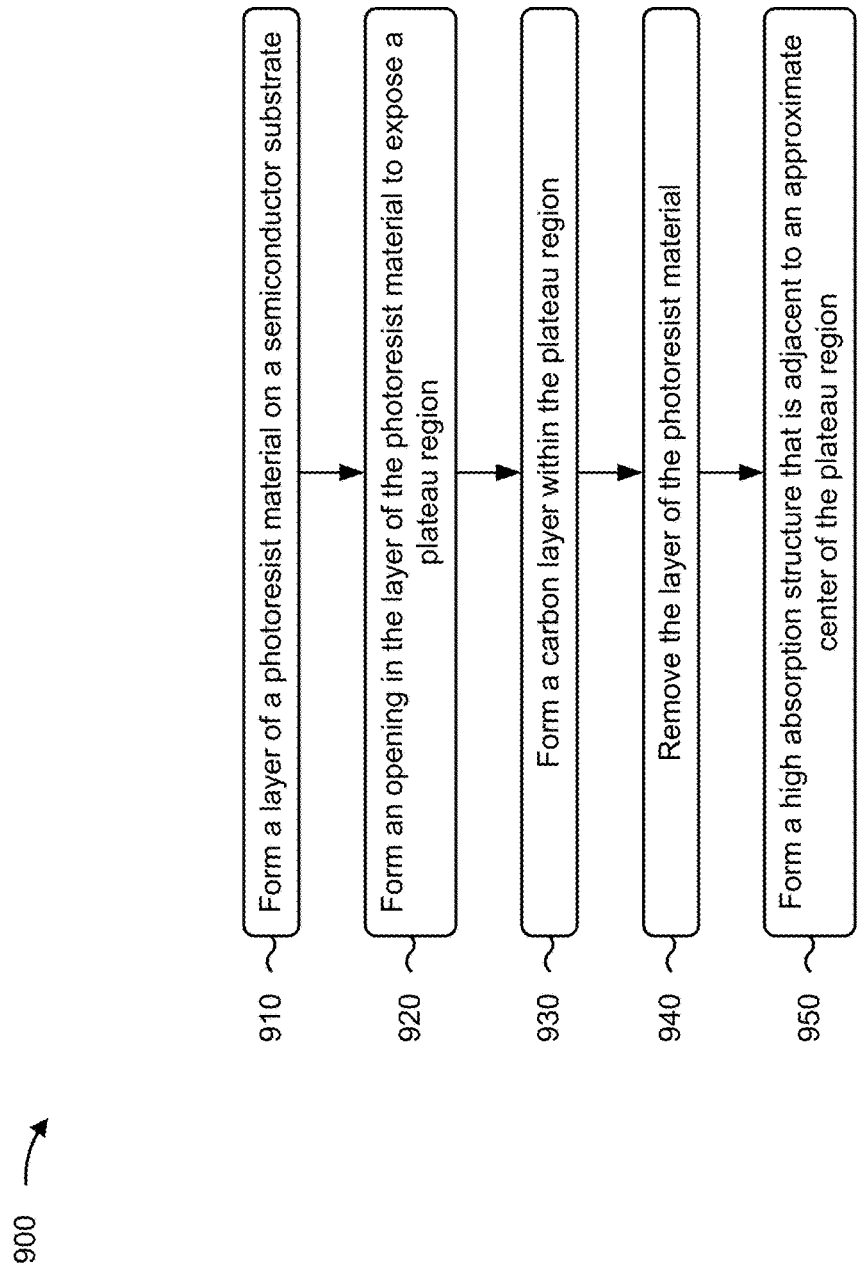

FIG. 9 is a flowchart of an example process 900 relating to forming the image sensor including the high absorption structure. In some implementations, one or more process blocks of FIG. 9 are performed by one or more of semiconductor processing tools (e.g., one or more of the semiconductor processing tools 102-114). Additionally, or alternatively, one or more process blocks of FIG. 9 may be performed by one or more components of device 700, such as processor 720, memory 730, input component 740, output component 750, and/or communication component 760.

As shown in FIG. 9, process 900 may include forming a layer of a photoresist material on a semiconductor substrate (block 910). For example, one or more of the semiconductor processing tools 102-114 may form a layer of a photoresist material 406 on a semiconductor substrate (e.g., the substrate layer 320 and/or the photodiode 322), as described above.

As further shown in FIG. 9, process 900 may include forming an opening in the layer of the photoresist material to expose a plateau region (block 920). For example, one or more of the semiconductor processing tools 102-114 may form an opening 408 the layer of the photoresist material 406 to expose a plateau region 330, as described above.

As further shown in FIG. 9, process 900 may include forming a carbon layer within the plateau region (block 930). For example, one or more of the semiconductor processing tools 102-114 may form a carbon layer 354 within the plateau region 330, as described above.

As further shown in FIG. 9, process 900 may include removing the layer of the photoresist material (block 940). For example, one or more of the semiconductor processing tools 102-114 may remove the layer of the photoresist material 406, as described above.

As further shown in FIG. 9, process 900 may include forming a high absorption structure that is adjacent to an approximate center of the plateau region (block 950). For example, one or more of the semiconductor processing tools 102-114 may form a HA structure 350 that is adjacent to an approximate center (e.g., the central axis 352) of the plateau region 330, as described above.

Process 900 may include additional implementations, such as any single implementation or any combination of implementations described below and/or in connection with one or more other processes described elsewhere herein.

In a first implementation, removing the layer of the photoresist material 406 includes removing the layer of the photoresist material 406 using a wet strip operation, where the wet strip operation uses a chromium based solvent.

In a second implementation, alone or in combination with the first implementation, forming the HA structure 350 includes forming the HA structure 350 by performing a wet etch operation, where the wet etch operation uses a choline hydroxide etchant.

In a third implementation, alone or in combination with one or more of the first and second implementations, forming the HA structure 350c includes forming the HA structure 350c using a wet etch operation, where the carbon layer 354 blocks etchants during the wet etch operation, and where the wet etch operation is of a duration that is sufficient to form an inverted cavity (e.g., the cavity 402) having a triangle-shaped profile.

In a fourth implementation, alone or in combination with one or more of the first through third implementations, forming the HA structure 350e includes forming the HA structure 350e using a wet etch operation, where the carbon layer 354 blocks etchants during the wet etch operation, and where the wet etch operation is of a duration that is sufficient to form an inverted cavity (e.g., the cavity 402) having a trapezoid-shaped profile.

In a fifth implementation, alone or in combination with one or more of the first through fourth implementations, forming the HA structure 350a includes forming the HA structure 350a using a wet etch operation, where the wet etch operation is of a duration that is sufficient to form an inverted cavity (e.g., the cavity 402) having a triangle-shaped profile and to remove the plateau region 330.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Some implementations described herein provide an optoelectronic device and methods of formation. The optoelectronic device is fabricated using a series of operations that includes a patterning operation using a layer of a negative photoresist material, followed by a single dry etch operation, a single wet strip operation, and a single wet etch operation. The series of operations may include a reduced number of operations relative to another series of operations that include a patterning operation using a layer of a positive photoresist material. Through the reduced number of operations, handling-induced damage to the device may be reduced. Additionally, the HA structure may include a quantum efficiency that is greater relative to another quantum efficiency of another HA structure formed through the series of operations that include the patterning operation using the layer of the positive photoresist material.

In this way, a manufacturing yield of an optoelectronic device including the HA structure that satisfies the quantum efficiency threshold may increase relative to another optoelectronic device not including the HA structure. Additionally, or alternatively, an amount of resources to fabricate a volume of the optoelectronic device including the HA structure (e.g., an amount of semiconductor manufacturing tools, raw materials, manpower, and/or computing resources, among other examples) may be decreased.

As described in greater detail above, some implementations described herein provide an optoelectronic device. The optoelectronic device includes a first high absorption structure penetrating into a semiconductor substrate. The optoelectronic device includes a second high absorption structure penetrating into the semiconductor substrate and adjacent to the first high absorption structure. The optoelectronic device includes a plateau region including a carbon layer, where the plateau region is immediately and horizontally between the first high absorption structure and the second high absorption structure.

As described in greater detail above, some implementations described herein provide a method. The method includes patterning a field of openings in a layer of a negative photoresist material on a semiconductor substrate. The method includes forming a field of high absorption structures within the field of openings by performing a single dry etch operation, where the single dry etch operation forms a carbon layer on a surface the semiconductor substrate, a single wet strip operation after the single dry etch operation, where the single wet strip operation removes the layer of the negative photoresist material, and a single wet etch operation after the single wet strip operation.

As described in greater detail above, some implementations described herein provide a method. The method includes forming a layer of a photoresist material on a semiconductor substrate. The method includes forming an opening in the layer of the photoresist material to expose a plateau region. The method includes forming a carbon layer within the plateau region. The method includes removing the layer of the photoresist material. The method includes forming a high absorption structure that is adjacent to an approximate center of the plateau region.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optoelectronic device, comprising:
a first high absorption structure penetrating into a semiconductor substrate;
a second high absorption structure penetrating into the semiconductor substrate and adjacent to the first high absorption structure, wherein each of the first high absorption structure and the second high absorption structure comprises surfaces comprising pitting, wherein the pitting comprises scallop-shaped regions extending into the surfaces; and
a plateau region comprising a carbon layer,
wherein the plateau region is immediately and horizontally between the first high absorption structure and the second high absorption structure.

2. The optoelectronic device of claim 1,
wherein the first high absorption structure and the second high absorption structure each comprise:
an inverted triangle-shaped profile.

3. The optoelectronic device of claim 1,
wherein the first high absorption structure and the second high absorption structure each comprise:
an inverted trapezoid-shaped profile.

4. The optoelectronic device of claim 1,
wherein the plateau region comprises:
a width that is included in a range of approximately 100 microns to approximately 500 microns.

5. The optoelectronic device of claim 1,
wherein the first high absorption structure and the second high absorption structure each comprises an inverted pyramid-shaped profile or an inverted conical-shaped profile.

6. The optoelectronic device of claim 1,
wherein the plateau region has a width between approximately 100 microns and approximately 500 microns.

7. A method, comprising:
patterning a field of openings in a layer of a negative photoresist material on a semiconductor substrate; and
forming a field of high absorption structures within the field of openings by performing:
a single dry etch operation,
wherein the single dry etch operation forms a carbon layer on a surface the semiconductor substrate;
a single wet strip operation after the single dry etch operation,
wherein the single wet strip operation removes the layer of the negative photoresist material; and
a single wet etch operation after the single wet strip operation.

8. The method of claim 7,
wherein performing the single dry etch operation comprises:
performing the single dry etch operation using a carbon-fluoride based etchant.

9. The method of claim 7,
wherein performing the single wet etch operation comprises:
performing the single wet etch operation using a tetramethyl ammonium hydroxide based etchant.

10. The method of claim 7,
wherein performing the single wet etch operation comprises:
performing the single wet etch operation to form a field of inverted pyramid- shaped cavity regions that penetrate into the semiconductor substrate.

11. The method of claim 7,
wherein performing the single wet etch operation comprises:
performing the single wet etch operation to form a field of plateau regions and a field of cavity regions,
wherein the field of cavity regions penetrates into the semiconductor substrate, and
wherein the field of plateau regions is interspersed amongst the field of cavity regions.

12. The method of claim 7,
wherein performing the single wet etch operation forms a field of smooth surfaces that angle into the semiconductor substrate, and further comprising:
 forming pitting in the field of smooth surfaces.

13. The method of claim 12,
wherein forming the pitting in the field of smooth surfaces comprises:
 using a dry etch operation to form at least a portion of the pitting in the field of smooth surfaces.

14. The method of claim 12,
wherein forming the pitting in the field of smooth surfaces comprises:
 using a laser operation to form at least a portion of the pitting in the field of smooth surfaces.

15. A method, comprising:
forming a layer of a photoresist material on a semiconductor substrate;
forming an opening in the layer of the photoresist material to expose a plateau region;
forming a carbon layer within the plateau region;
removing the layer of the photoresist material; and
forming a high absorption structure that is adjacent to an approximate center of the plateau region.

16. The method of claim 15,
wherein removing the layer of the photoresist material comprises:
 removing the layer of the photoresist material using a wet strip operation, wherein the wet strip operation uses a chromium based solvent.

17. The method of claim 15,
wherein forming the high absorption structure comprises:
 forming the high absorption structure by performing a wet etch operation, wherein the wet etch operation uses a choline hydroxide based etchant.

18. The method of claim 15,
wherein forming the high absorption structure comprises:
 forming the high absorption structure using a wet etch operation,
  wherein the carbon layer blocks etchants during the wet etch operation, and
  wherein the wet etch operation is of a duration that is sufficient to form an inverted cavity having a triangle-shaped profile.

19. The method of claim 15,
wherein forming the high absorption structure comprises:
 forming the high absorption structure using a wet etch operation,
  wherein the carbon layer blocks etchants during the wet etch operation, and
  wherein the wet etch operation is of a duration that is sufficient to form an inverted cavity having a trapezoid-shaped profile.

20. The method of claim 15,
wherein forming the high absorption structure comprises:
 forming the high absorption structure using a wet etch operation,
  wherein the wet etch operation is of a duration that is sufficient to form an inverted cavity having a triangle-shaped profile and to remove the plateau region.

* * * * *